United States Patent
Nagao et al.

(10) Patent No.: US 6,546,535 B1
(45) Date of Patent: Apr. 8, 2003

(54) PROCESSING METHOD AND APPARATUS FOR DESIGNING INSTALLATION LAYOUT OF SOLAR CELL MODULES IN PHOTOVOLTAIC POWER GENERATION SYSTEM AND COMPUTER PROGRAM PRODUCT STORING THE PROCESSING METHOD

(75) Inventors: Yoshitaka Nagao, Kyoto (JP); Akiharu Takabayashi, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/353,602

(22) Filed: Jul. 14, 1999

(30) Foreign Application Priority Data

Jul. 15, 1998 (JP) .......................................... 10-214776

(51) Int. Cl.[7] .............................................. G06F 17/50
(52) U.S. Cl. .................................... 716/11; 136/243
(58) Field of Search .................. 716/11, 1, 2; 136/234, 136/244

(56) References Cited

U.S. PATENT DOCUMENTS 6,111,188 A * 8/2000 Kurokami .................. 136/293

OTHER PUBLICATIONS

Knaupp, W., "Operation behaviour of roof installed modules"., IEEE, May 1996, pp. 1445–1448.*

Knaupp, W., "Evaluation of PV module designs at irregular operation conditions". IEEE. Oct. 1997, pp. 1213–1216.*

Van Der Weiden, T.C.J., "Calculated effect of central DC/AC power conversion from generators with different orientations". IEEE. pp. 844–845.*

* cited by examiner

Primary Examiner—John F. Niebling
Assistant Examiner—Stacy Whitmore
(74) Attorney, Agent, or Firm—Fitzpatrick, Cella, Harper & Scinto

(57) ABSTRACT

A computer processing method for designing an installation layout of solar cell modules on an installation surface of a photovoltaic power generation system is provided. Installation information of the solar cell modules are automatically calculated so as to be fit within the installable area of the installation surface on the basis of information on the solar cell module, information on the installation surface, and information on installation conditions of the solar cell modules, and the calculated installation information is outputted.

81 Claims, 39 Drawing Sheets

FIG. 19

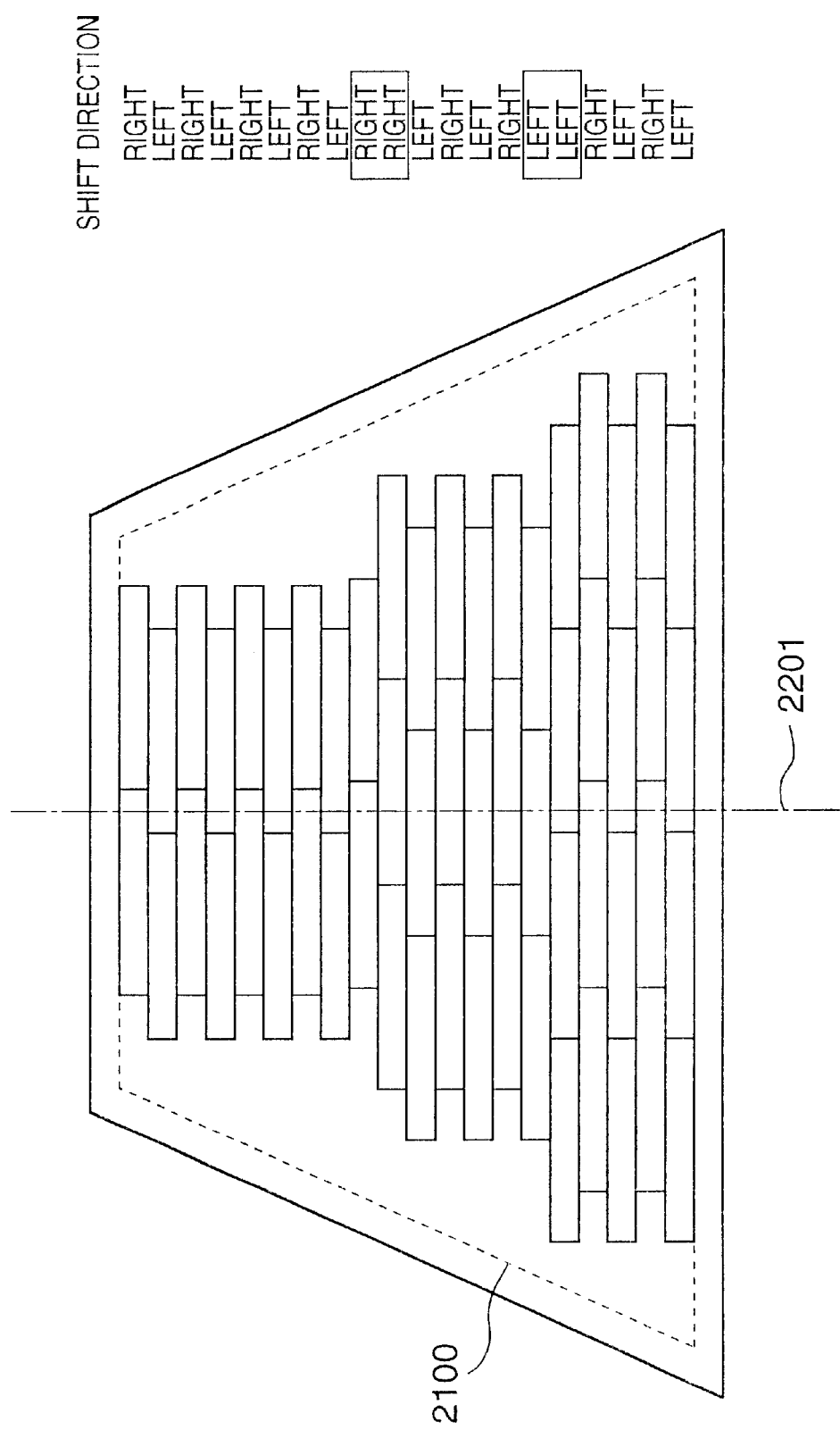

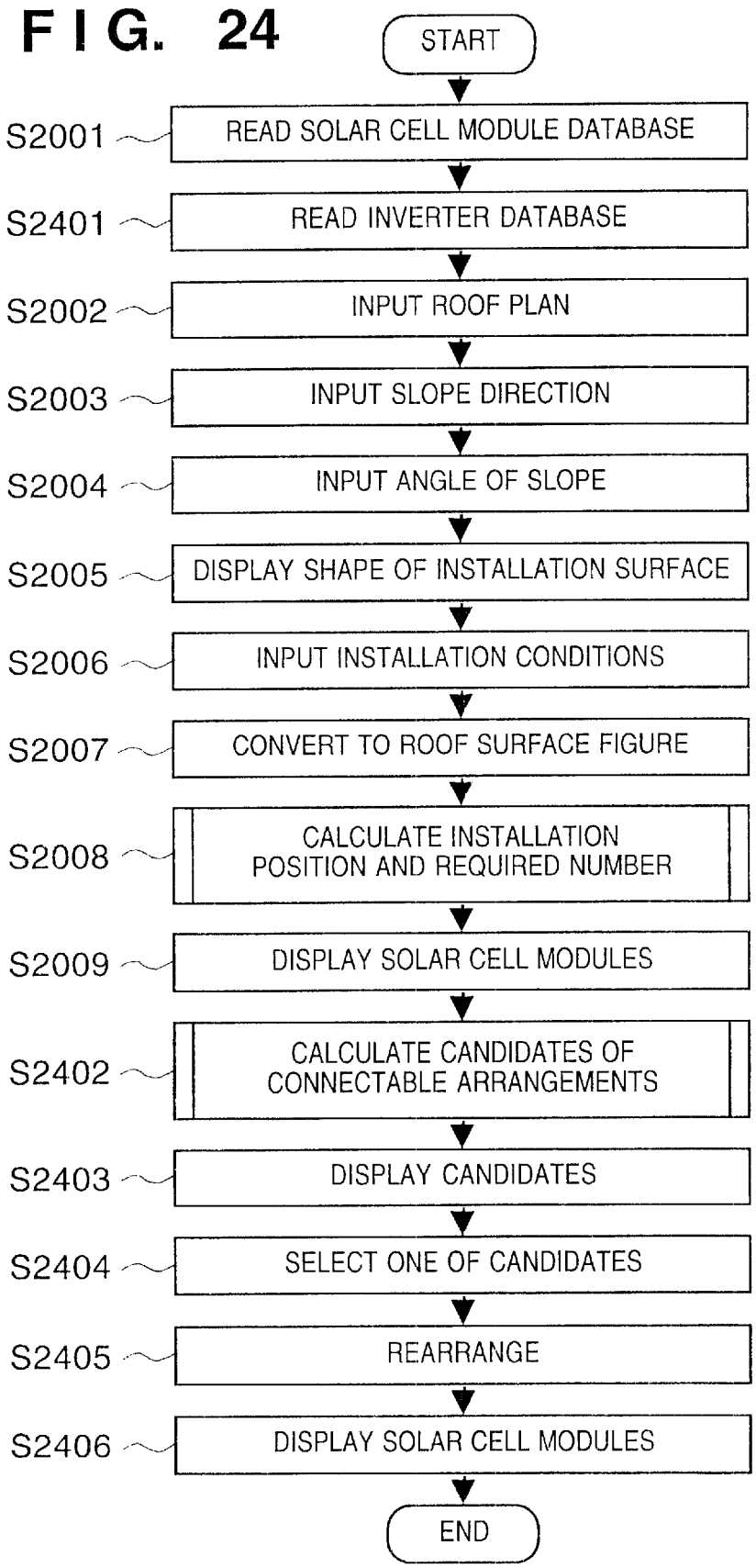

FIG. 26

DETAIL

MAXIMUM CONNECTABLE NUMBER (TOTAL MODULE NUMBER) 112

| | IN SERIES | IN PARALLEL | TOTAL NUMBER | RATED DC OUTPUT | CONNECTABLE/ NOT CONNECTABLE |
|---|---|---|---|---|---|
| SI-01 | 18 | 6 | 108 | 3,456 | CONNECTABLE |
| | 19 | 5 | 95 | 3,040 | CONNECTABLE |
| | 20 | 5 | 100 | 3,200 | CONNECTABLE |
| | 21 | 5 | 105 | 3,360 | CONNECTABLE |
| | 22 | 5 | 110 | 3,520 | CONNECTABLE |
| | 23 | 4 | 92 | 2,944 | CONNECTABLE |
| SI-02 | 24 | 4 | 96 | 3,072 | CONNECTABLE |
| | 25 | 4 | 100 | 3,200 | CONNECTABLE |
| | 26 | 4 | 104 | 3,328 | CONNECTABLE |
| | 27 | 4 | 108 | 3,456 | CONNECTABLE |
| | 28 | 4 | 112 | 3,584 | CONNECTABLE |
| | 29 | 3 | 87 | 2,784 | CONNECTABLE |
| | 30 | 3 | 90 | 2,880 | CONNECTABLE |
| | 31 | 3 | 93 | 2,976 | CONNECTABLE |

PRINT   CONFIRM

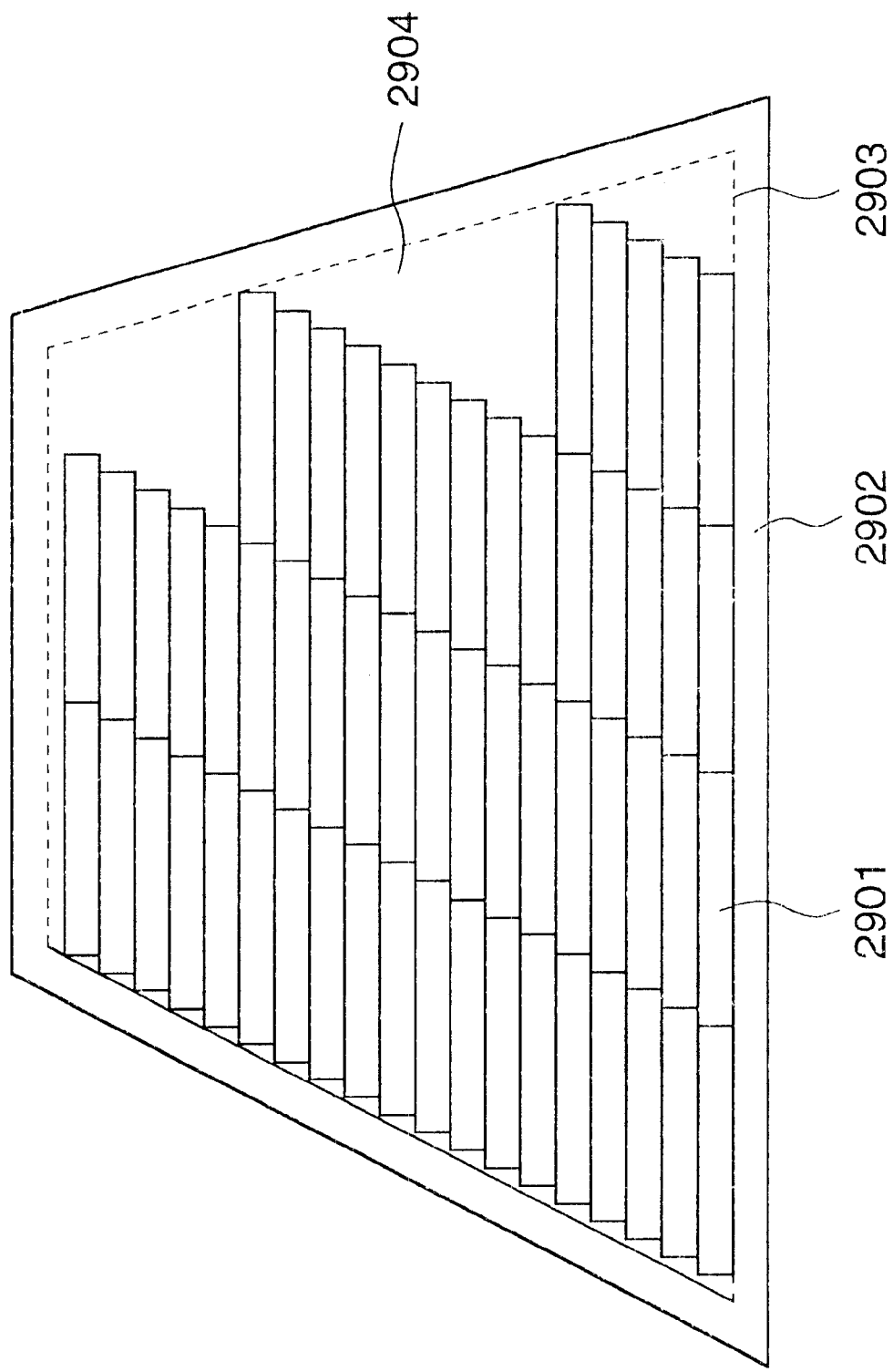

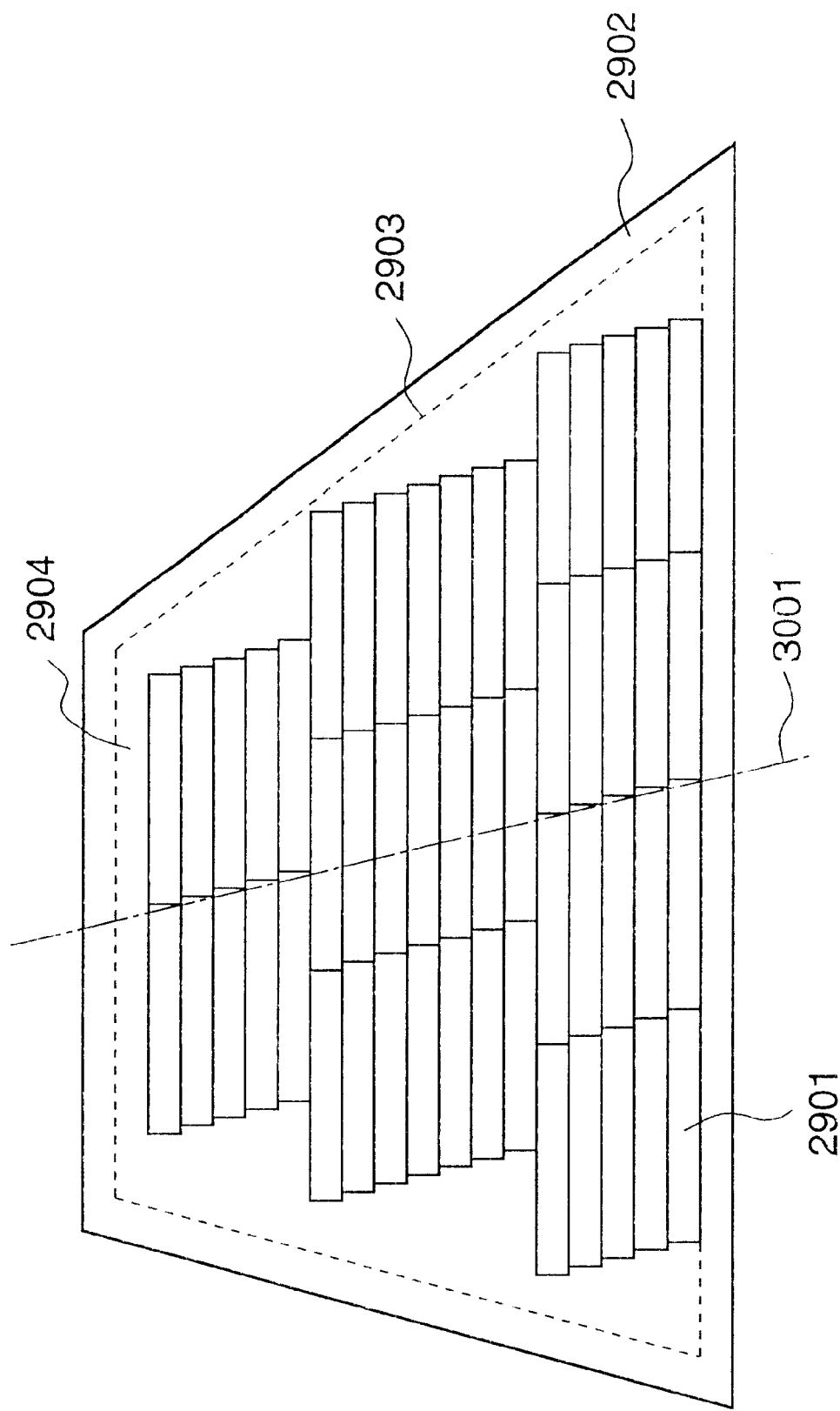

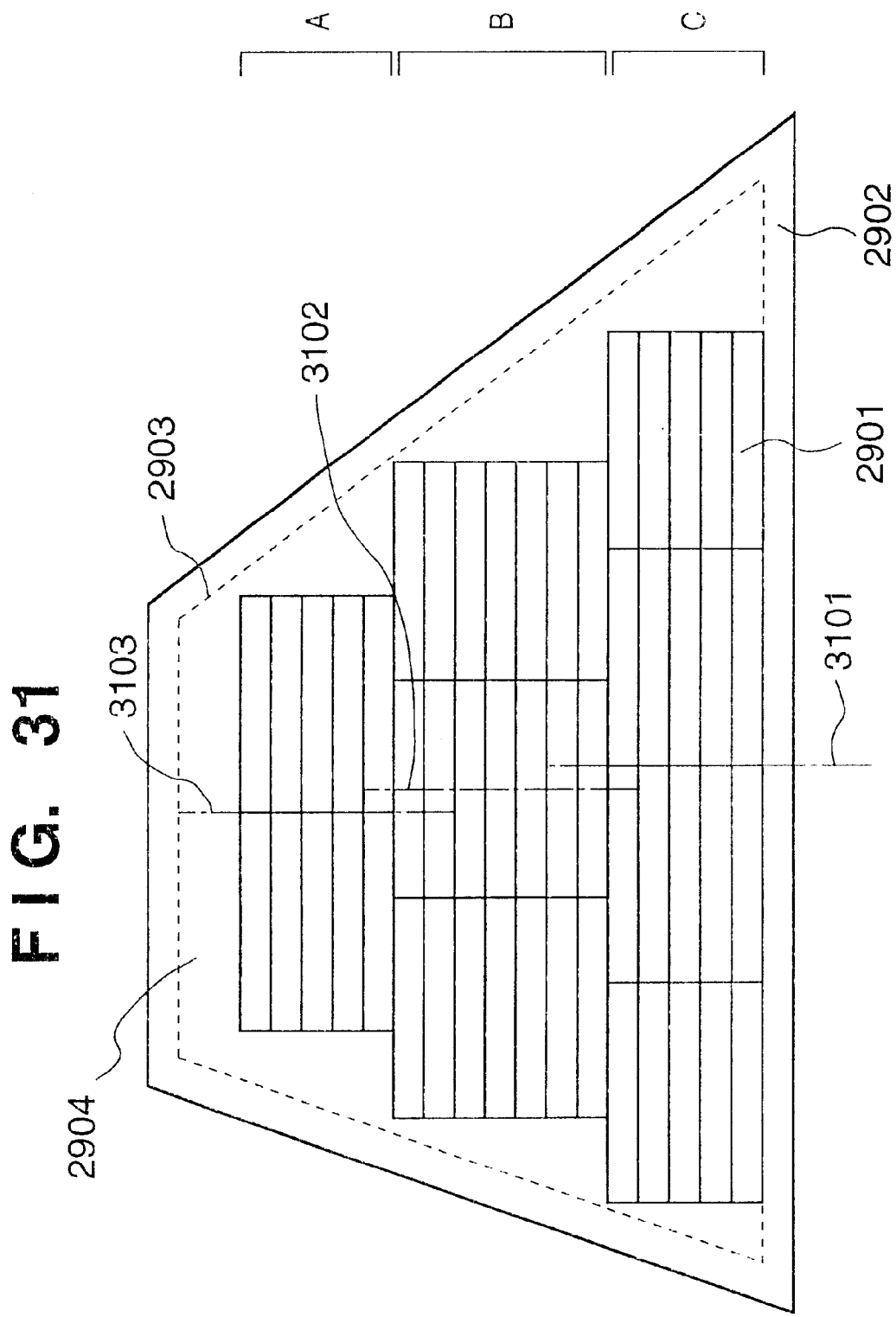

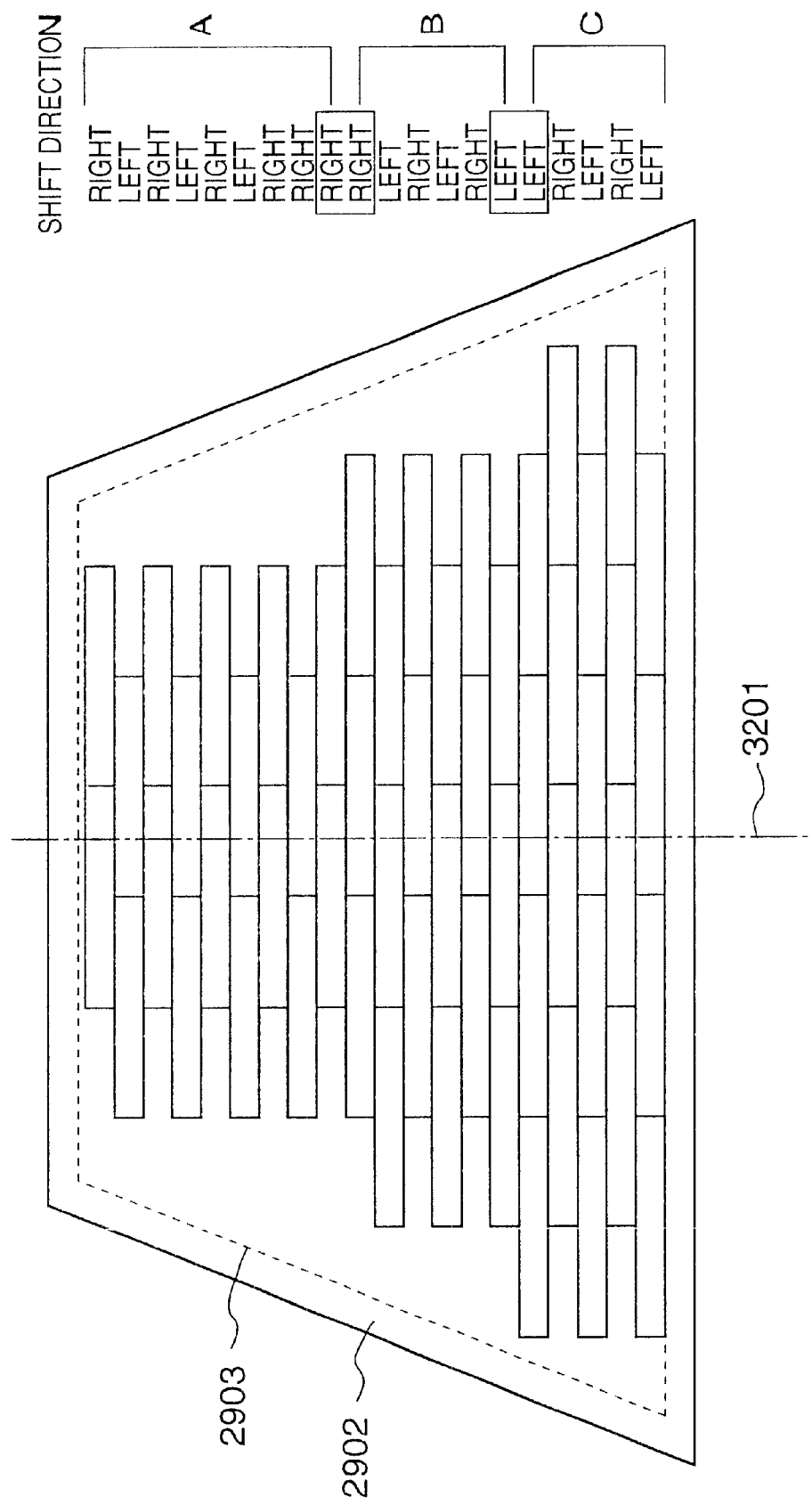

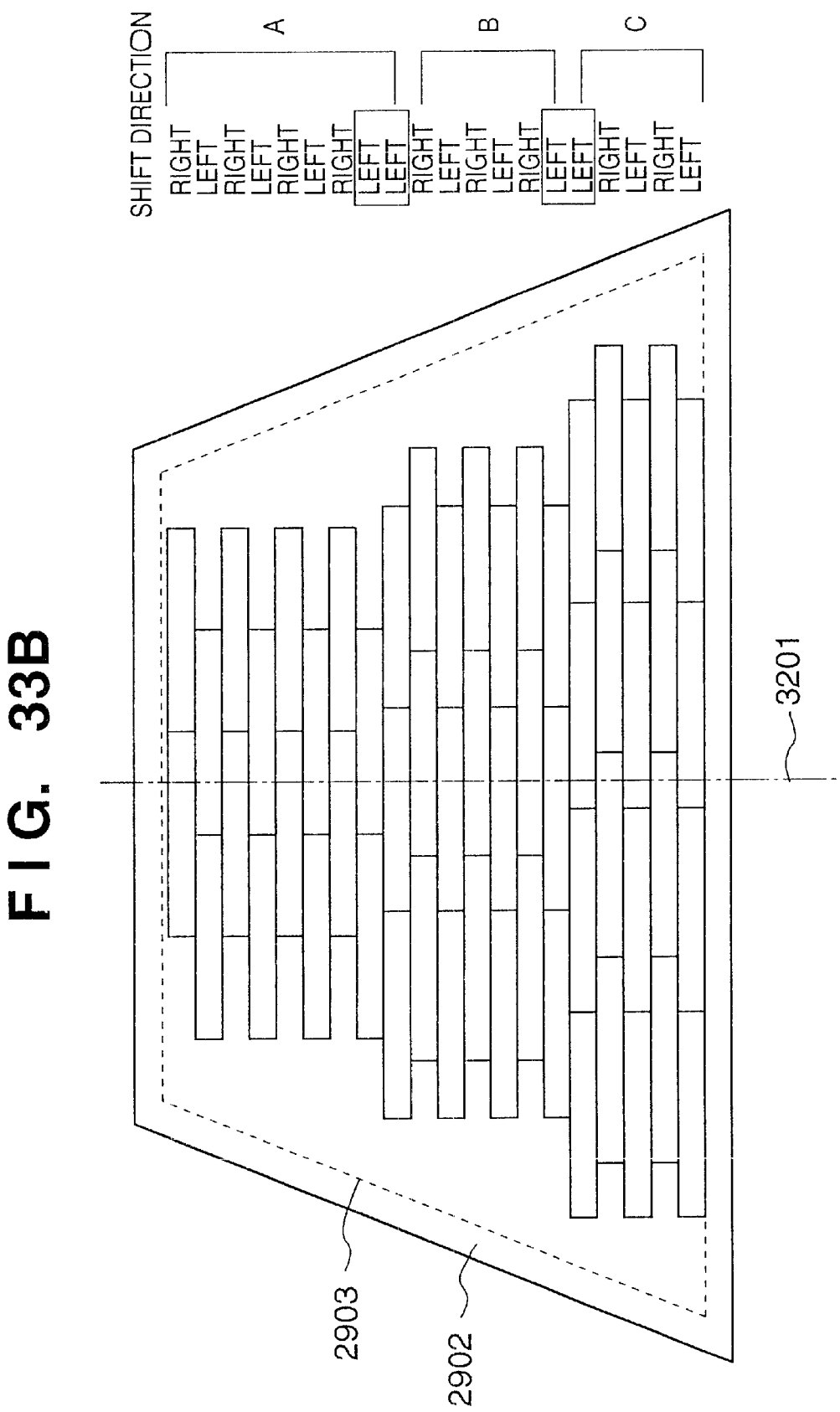

PROCESSING METHOD AND APPARATUS FOR DESIGNING INSTALLATION LAYOUT OF SOLAR CELL MODULES IN PHOTOVOLTAIC POWER GENERATION SYSTEM AND COMPUTER PROGRAM PRODUCT STORING THE PROCESSING METHOD

BACKGROUND OF THE INVENTION

The present invention relates to a computer aided design (CAD) system for arranging photovoltaic power generation modules to be installed on exterior, such as a roof and walls, of a building and, more particularly, to a CAD system for simulating an arrangement and electric connection of a plurality of solar cell modules and planning an arrangement of solar cell modules on a roof.

Recently, anathermal of the earth, exhaustion of fossil fuels, and radioactive contamination caused by accidents in nuclear power plants and radioactive wastes have become social issues, and the issues on the terrestrial environment and energy are rapidly collecting interests of many people. Under this situation, a solar cell, for example, which generates electric power from the solar ray that is an inexhaustible clean energy source, is anticipated as the energy source of tomorrow. Especially, solar batteries which can be installed on a roof of a residence were proposed recently and used more frequently than ever.

As for installation of solar batteries on a roof of a building, there are methods for setting racks or fixing members on a roof and fixing solar panels on it and methods for integrating photovoltaic power generation devices and roofing boards (referred to as "solar panel roofing board module" hereinafter) and setting solar panel roofing board modules on roof boards instead of general roofing boards.

These solar cell modules, such as solar panels and solar panel roofing board modules, have configurations for outputting electrical power on the back (i.e., not on photo-receiving surfaces), and are connected to each other using wiring members, such as cables. The end of the cable of the connected solar cell modules is generally connected to a terminal board, called connection box, for connecting ends of cables of plural serial-connected solar cell module strings in parallel.

DC (direct current) power outputted from the plural solar cell module strings connected in parallel is inverted into AC (alternating current) power by a power inverter apparatus, called an inverter, and the AC power being consumed in the residence or sent to an electric power company in the reverse current connection.

Especially, the solar panel roofing board modules can be used in place of conventional roofing boards without solar batteries (referred to as "general roofing boards" hereinafter), since the solar panel roofing board modules function as general roofing boards, and it is necessary to install the solar panel roofing board modules in the same manner for installing the conventional roofing boards. However, the following problems arise when installation method for installing the general roofing boards is directly applied to installation of the solar panel roofing board modules.

(1) Since a solar panel roofing board module must not be cut, it must be arranged so that the entire solar panel roofing board module fits within an installable area of an installation surface (i.e., a roof). In a case of a hip roof, for example, since the width of the roof decreases toward a ridge from eaves, not so many solar cell modules can be installed.

(2) Since the surface of a solar panel roofing board module is covered by, e.g., resin or glass, it is necessary to arrange solar panel roofing board modules in a repetitive pattern to make a roof look attractive.

(3) Since it is necessary to satisfy rated condition of an electric device to be connected to solar panel roofing board modules, electrical connection and arrangement of solar panel roofing board modules should be decided while taking the rated condition into consideration.

When roofing with general roofing boards, there is freedom of deciding positions of the roofing boards at a job site and no blueprint showing an arrangement of the roofing boards is used. In contrast, a blueprint showing the arrangement of solar panel roofing board modules in which electric wiring is taken into account is necessary when installing solar panel roofing board modules for the aforesaid reasons.

Further, since a solar panel roofing board module is more expensive than a general roofing board, it is necessary to determine the precise number of necessary solar panel roofing board modules than the number calculated in a conventional manner of accumulating the area of each roofing board up to an area of the roof.

Especially, the aforesaid problem (2) is not specific to a solar panel roofing board module, but also a problem with solar cell module to be set on a rack.

SUMMARY OF THE INVENTION

The present invention has been made in consideration of the above situation, and has as its object to provide supporting method and apparatus for arranging solar cell modules capable of solving the aforesaid problems, and a computer program product comprising a computer usable storage medium which stores the supporting method and configures a CAD system.

According to the present invention, the foregoing object is attained by providing a computer processing method for designing an installation layout of solar cell modules on an installation surface in a photovoltaic power generation system characterized by comprising, a solar cell module information acquisition step (601, S701, S2001) of acquiring information on a solar cell module, an installation surface information acquisition step (602, S702, S2002–S2004) of acquiring information on an installation surface where the solar cell module is to be installed, an installation condition acquisition step (603, S704, S2006) of acquiring installation conditions of the solar cell module, an installation information calculation step (604, S705, S2008) of calculating installation information for arranging the solar cell module on the installation surface on the basis of information acquired in the solar cell module information acquisition step, the installation surface information acquisition step, and the installation condition acquisition step, and an installation information output step (605, S706, S2009) of outputting the installation information calculated in the installation information calculation step.

Further, according to the present invention, the foregoing object is also attained by providing a computer processing method for designing an installation layout of solar cell modules on an installation surface in a photovoltaic power generation system characterized by comprising an installation information calculation step (604, S705, S2008) having, a step of dividing the solar cell modules into groups, a step of calculating an installation position of each of the solar cell modules in accordance with predetermined rules, and a step of calculating an installation position of each of the group.

Furthermore, according to the present invention, the foregoing object is also attained by providing a computer processing method for designing an installation layout of solar cell modules on an installation surface in a photovoltaic power generation system characterized by comprising an installation information calculation step (604, S705, S2008) having, a step of dividing the solar cell modules into groups, and a step of shifting positions of the solar cell modules by rows by a shift amount and a shift direction which are manually inputted or predetermined, whereby phases of the shift directions of adjoining blocks are opposite, and calculating installation information of the solar cell modules on the basis of the shifted positions.

Further, according to the present invention, the foregoing object is also attained by providing a processing apparatus for designing an installation layout of solar cell modules in a photovoltaic power generation system characterized by comprising, solar cell module information acquisition means (601) for acquiring information on a solar cell module, installation surface information acquisition means (602) for acquiring information on an installation surface where the solar cell module is to be installed, installation condition acquisition means (603) for acquiring installation conditions of the solar cell module, installation information calculation means (604) for calculating installation information for arranging the solar cell module on the installation surface on the basis of information acquired by the solar cell module information acquisition means, the installation surface information acquisition means, and the installation condition acquisition means, and installation information output means (605) for outputting the installation information calculated by the installation information calculation means.

Further, according to the present invention, the foregoing object is also attained by providing a processing apparatus for designing an installation layout of solar cell modules on an installation surface in a photovoltaic power generation system characterized by comprising installation information calculation means (604) having, means for dividing the solar cell modules into groups, means for calculating an installation position of each of the solar cell modules in accordance with predetermined rules, and means for calculating an installation position of each of the group.

Further, according to the present invention, the foregoing object is also attained by providing a processing apparatus for designing an installation layout of solar cell modules on an installation surface in a photovoltaic power generation system characterized by comprising installation information calculation means (604) having, means for dividing the solar cell modules into groups, and means for shifting positions of the solar cell modules by rows by a shift amount and a shift direction which are manually inputted or predetermined, whereby phases of the shift directions of adjoining blocks are opposite.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 19 shows an image displayed on a monitor in a case of arranging solar cell modules on a batten seam roof according to the first embodiment of the present invention;

FIG. 23 is a view showing another arrangement of solar cell modules when a shift amount is small according to the second embodiment of the present invention;

FIG. 24 is a flowchart showing an operation sequence according to a third embodiment of the present invention;

FIG. 26 shows an image of connection candidates displayed on a monitor according to the third embodiment of the present invention;

FIG. 29 is a view showing an arrangement of solar cell modules filled from the left side according to an embodiment of the present invention;

FIG. 30 is a view showing an arrangement of solar cell modules arranged by lines according to an embodiment of the present invention;

FIG. 31 is a view showing an arrangement of solar. cell modules arranged by groups according to an embodiment of the present invention;

FIG. 33A and FIG. 33B are views showing an arrangement of solar cell modules when shifting directions are controlled so as not always alternate under predetermined conditions.

DETAILED DESCRIPTION OF THE PREFERRED EMBODIMENTS

Preferred embodiments of the present invention will be described in detail below in accordance with the accompanying drawings.

First, a basic configuration of the present invention is explained.

Solar Cell Module

Figure 1A:
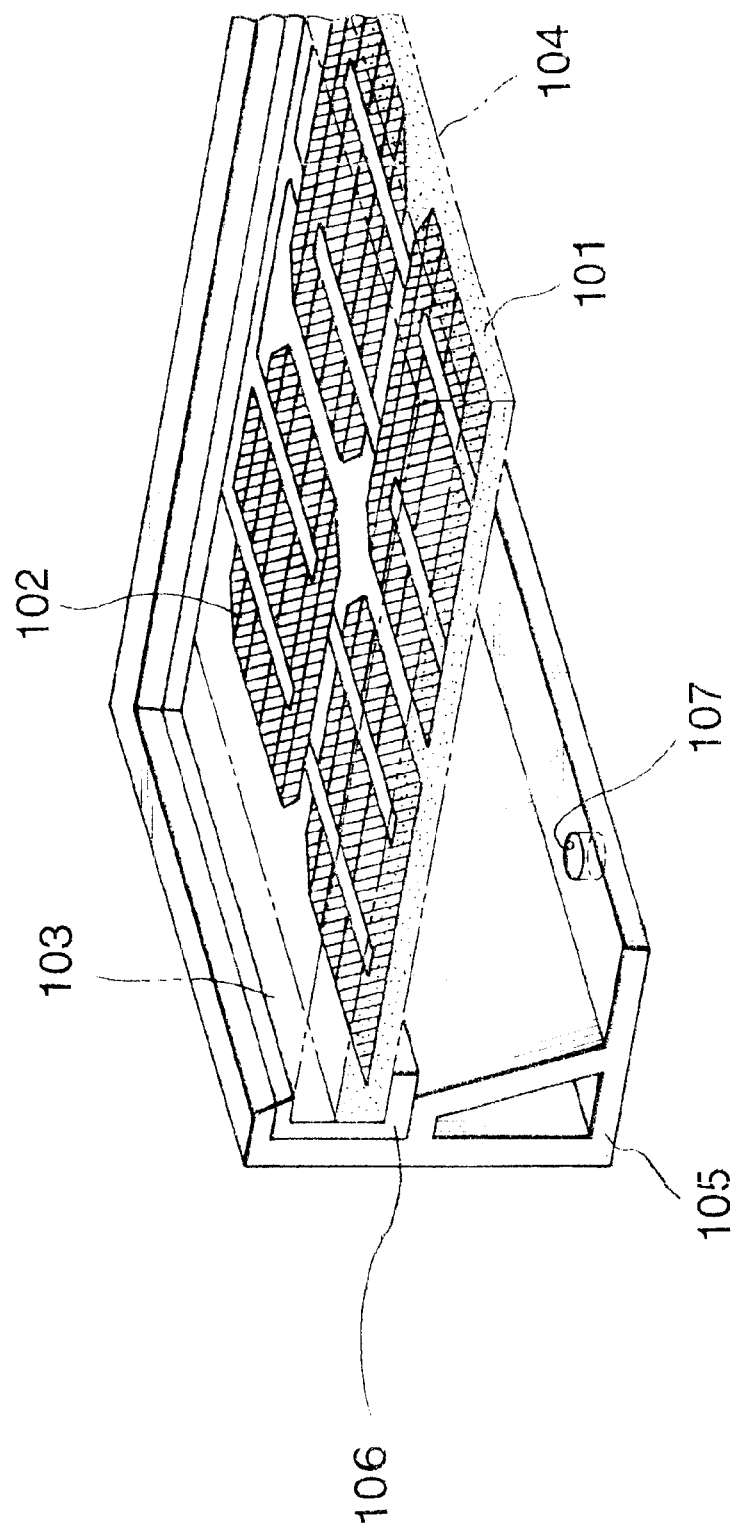
FIG. 1A is a cross-sectional view of a rack-installation type solar cell module.
Figure 1B:
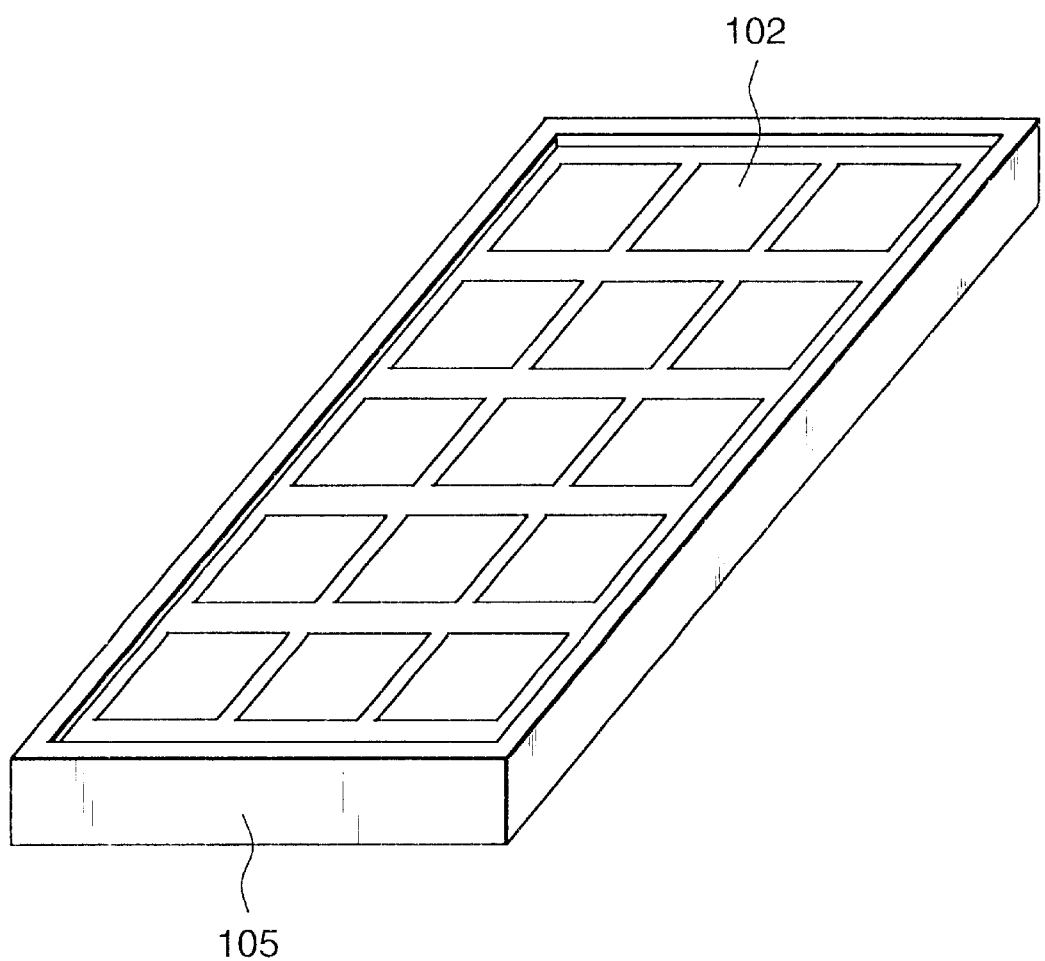
FIG. 1B is an overall view of the rack-installation type solar cell module.

FIG. 1A is a cross sectional view of a rack-installation type solar cell module and FIG. 1B shows an overall view of the rack-installation type solar cell module.

A solar cell element 102 of the rack-installation type solar cell module may be any kind of photoelectric elements made of, e.g., singlecrystalline silicon, polycrystalline silicon, microcrystalline silicon, amorphous silicon, and compound semiconductor. The solar cell element 102 is encapsulated between a front cover 103 on a photo-receiving side and a back cover 104 with resin filler 101. Peripheral portions are sealed to a frame 105 with a sealing material 106 to improve sealing condition, and a rib 107 for fixing onto a rack is provided on the longer side of the frame 105 on the back side of the solar cell module.

Figure 2A:
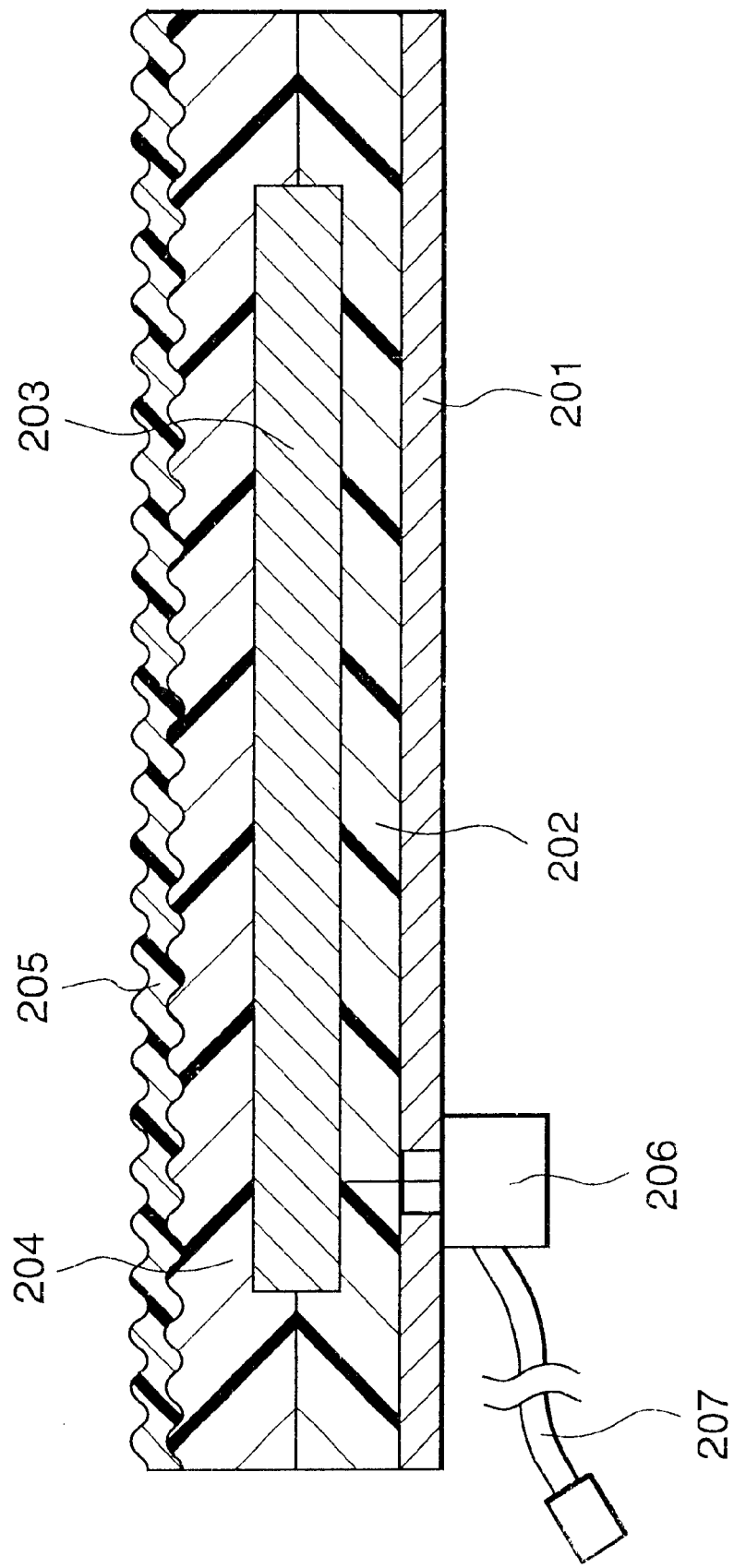
FIG. 2A is a cross-sectional view of a solar panel roofing board module.
Figure 2B:
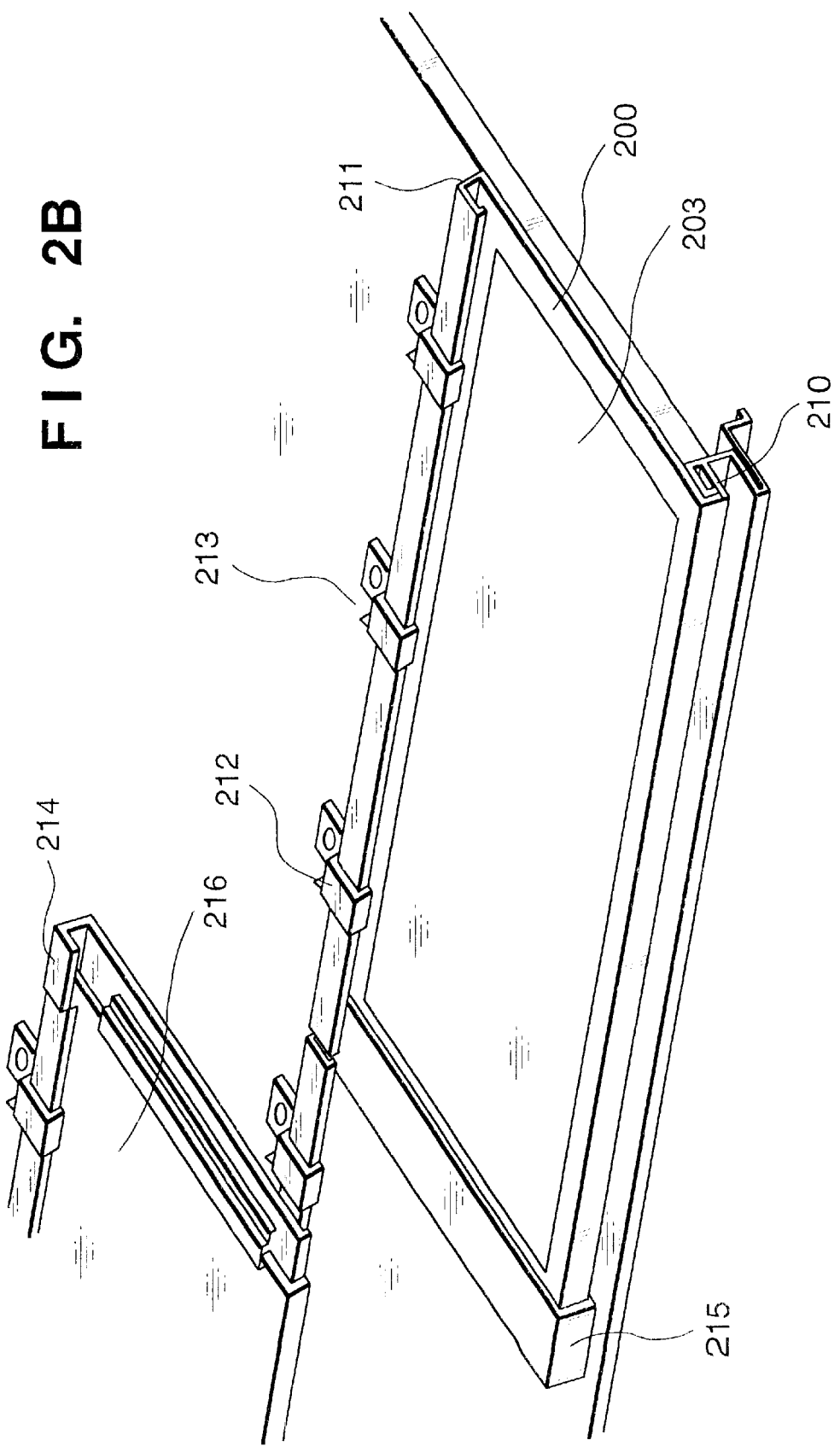
FIG. 2B is an explanatory view for explaining an installation method of a solar panel roofing module on a stepping roof.

Building material integrated solar cell modules are those in which solar batteries and usual building materials, such as roofing material and wall material, are integrated, and those building material integrated solar cell modules are designed so that they are installed on a building in a conventional construction method. FIGS. 2A and 2B show a solar panel roofing board module as an example of the building material integrated solar cell module.

FIG. 2A is a cross sectional view of a solar panel roofing board module. Referring to FIG. 2A, a back surface protective film 202, a solar cell element 203, a surface encapsulating member 204, and a front surface protective film 205 are provided on a back reinforcing plate 201. The solar cell element 203 may be any kind of photoelectric elements made of, e.g., singlecrystalline silicon, polycrystalline silicon, microcrystalline silicon, and amorphous silicon. Among these materials, amorphous silicon is preferably used since it is flexible and can be curved. The back reinforcing plate 201 is required to be weather resistance, strong, and flexible, and a stainless plate, a kalamein plate, and a 55% Al-Zn ceated steel sheet are often used. The back surface protective film 202 has to be insulated and durable, and nylon, polyvinyl fluoride (PVF), and polyethylene terephthalate (PET) are often used with adhesive.

The surface encapsulating member 204 is required to be weather resistance, adhesive, easy to fill, heat resistance, cold resistance, and impact resistance, and may be made of ethylene-vinyl acetate copolymer (EVA), ethylene-ethyl acrylate copolymer (EEA), polyolefine resin, urethane resin, silicon resin, and fluororesin, for instance. Especially, the EVA is a balanced material for a solar cell, therefore preferably used. The front surface protective film 205 is required to be weather resistance, dust resistance, mechanically strong, and qualified for securing reliability for a long term operation of a solar cell module installed outside. As for such a material, polyvinylidene fluoride, and polyvinyl fluoride, or ethylene-tetrafluoroethylene copolymer (ETFE) are preferably used. On the backside of the back reinforcing plate 201, a terminal box 206 and a cable 207 ate provided for drawing electric power from the solar cell elements 203.

Such a solar cell module may be formed into a solar panel roofing board module by bending the module arbitrarily.

FIG. 2B shows an example when the solar cell module is formed to be a roofing board for a stepping roof, and installed as a roof. The long sides of each solar panel roofing board module 200 are bent to form an eaves-side engagement portion 210 and a ridge-side engagement portion 211.

The ridge-side engagement portion 211 is fixed on a roof surface 213, such as roof boards, by clips 212. Further, solar panel roofing board modules 200 are connected in the horizontal direction using joint members 214 and joint covers 215. Further, solar panel roofing board modules 200 are connected in the vertical direction by seaming the eaves-side engagement portions 210 and the ridge-side engagement portions 211. In the photovoltaic power generation roof of the present invention, the solar panel roofing board modules 200 and general roofing boards 216 can be used together.

The solar cell modules output DC power. A plurality of solar cell modules are connected in series to form a solar cell string, and a plurality of solar cell strings are connected in parallel, thereby a solar cell array is formed.

Installation Surface

Figure 3:
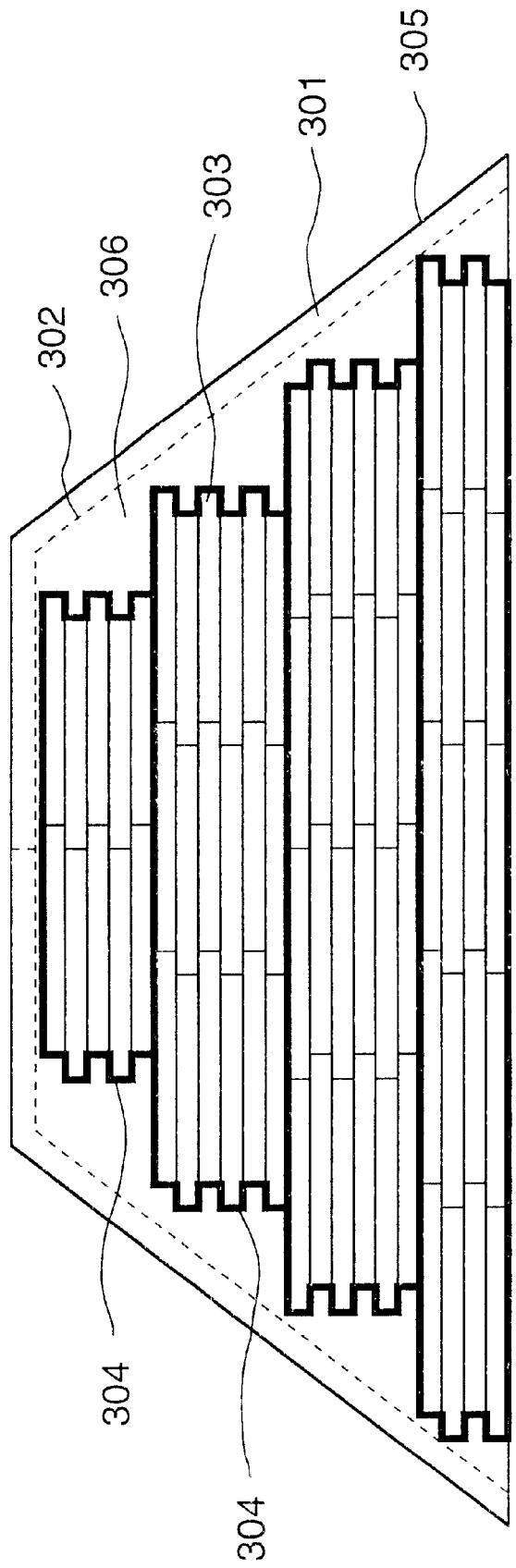
FIG. 3 shows an example of an arrangement of solar panel roofing board modules on a roof.

FIG. 3 shows an example of an arrangement of solar panel roofing board modules on a roof.

An installation surface 301 where the solar cell modules are installed is mainly a roof; however, it may be any other sur face, such as an external wall and a retaining wall as far as the solar cell modules can be fixed on. There are a variety of roof types, such as a gable roof and a hip roof, for a residence, and the present invention is applicable to any types of roofs. When a solar cell module 303 is a roofing material integrated type (i.e., solar panel roofing board module), general roofing boards may be used in an area 306 which is within an installable area on the installation surface 301 but where the solar panel roofing board module 303 can not be fit.

For installing solar cell modules in an installation surface, the following conditions must be satisfied.

<Rack-Installation Type Solar cell Modules>

A roof where the solar cell modules are installed has to have strength to endure pressures due to, e.g., weight of itself, weight of snow on the roof, and wind force.

It is preferable to avoid installing the solar cell module on edge portions of eaves, verge, and ridge in consideration of wind force since a wind constant is higher at the edge portions of eaves, the verge, and the ridge than at a central portion of a roof as indicated in the "Standard of Roofing Materials, Exterior Materials, and Curtain Walls Facing Outside" (Notification No. 109 of the Ministry of Construction).

<Solar Panel Roofing Board Modules>

Solar panel roofing board modules can be arranged in the same manner as general roofing modules except that the solar panel roofing board module must not be cut. Therefore, in arranging the solar panel roofing board modules, it is necessary to take verge, corner ridge, and edge covers into consideration.

Due to the aforesaid conditions, neither the rack-installation type solar cell module nor the solar panel roofing board module can be installed on the entire area of a roof, and limited to an installable area 302, which is an area inside of the dot line. In FIG. 3, reference numeral 304 denotes solar cell module groups (inside of bold lines). In each solar cell module group 304, n (n is an integer greater than 1) solar cell modules 303 are connected in the horizontal direction and a plurality of such connected solar cell modules 303 are further connected in the vertical direction. Reference numeral 305 denotes an installation area limit line.

Electrical Equipment

Output power from the solar cell modules is provided to an electrical equipment to which DC power can be inputted.

Figure 4:
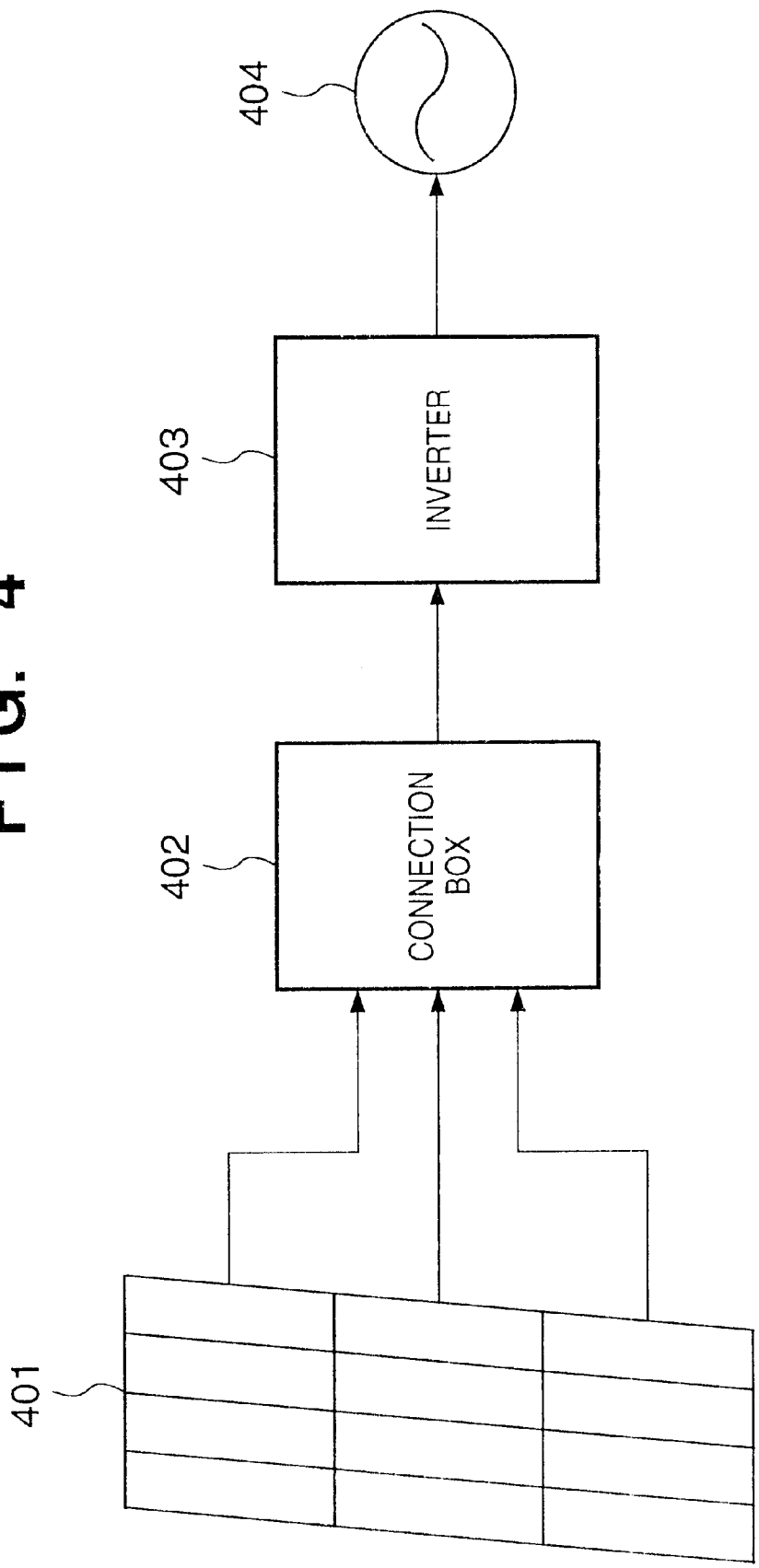
FIG. 4 is a block diagram of a photovoltaic power generation system.

As for such electrical equipment, there are an inverter, a charging/discharging control apparatus which is connected to a secondary battery, and a load, such as a motor and a fan. FIG. 4 shows an example of a photovoltaic power generation system, and a connection box 402 having a disconnector and a switch is provided to connect a plurality of serially-connected solar cell modules 401 in parallel. The DC power collected in the connection box 402 is converted into AC power by an inverter 403 and provided to a commercial power supply line 404 in the reverse current connection. Thus, the connection box 402 used for connecting a plurality of serially-connected solar cell modules 401 in parallel is included in the electrical equipment of the present invention.

It is necessary to determine the number of solar cell modules to be connected in series and parallel in consideration of the allowable input voltage and the allowable input power of the electrical equipment.

<Configuration of a Hardware>

Figure 5:
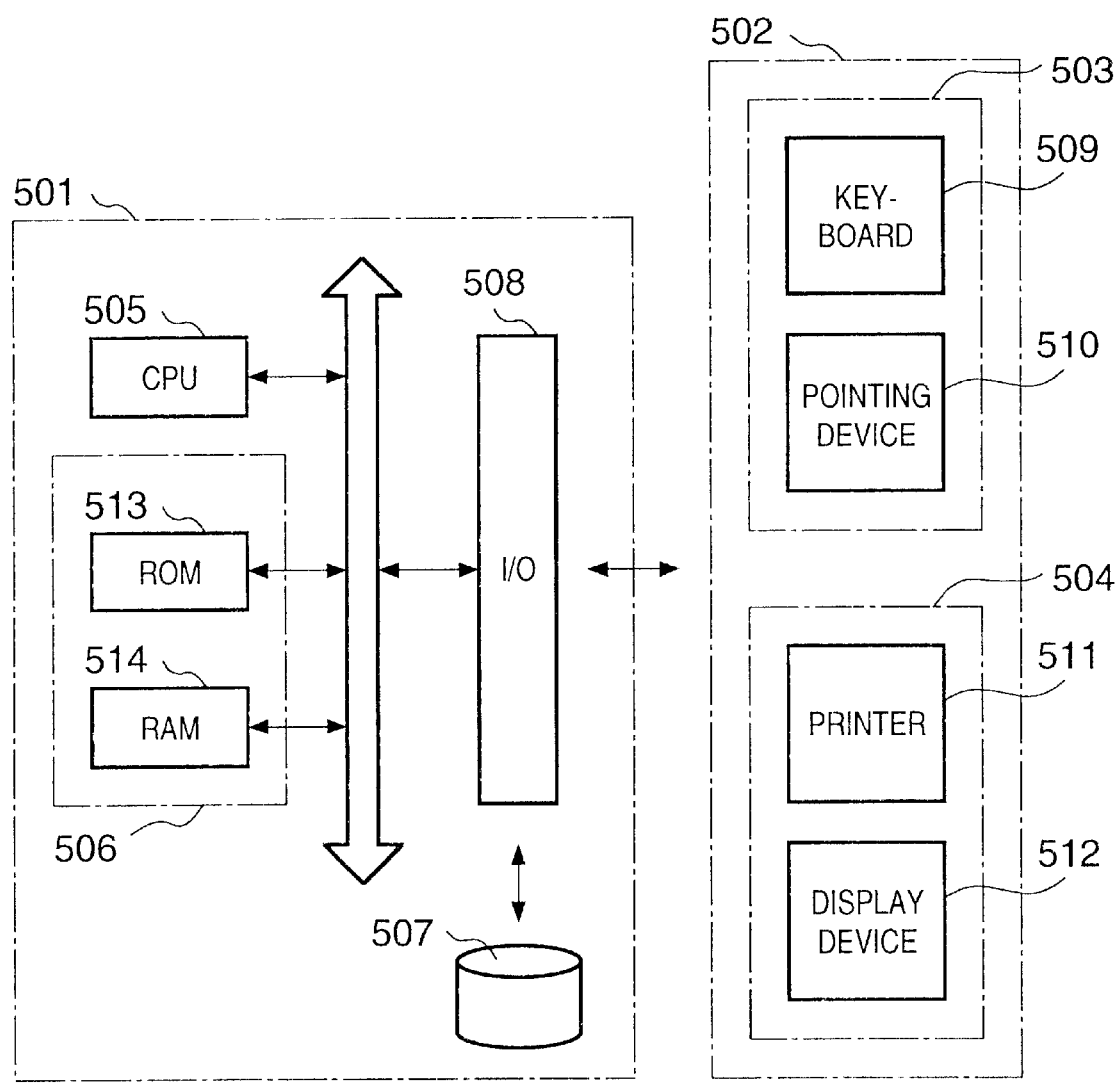
FIG. 5 is a block diagram of a configuration of a hardware of the present invention.

A configuration of a hardware of the present invention will be explained below with reference to FIG. 5.

A host computer main body 501 is configured with a CPU 505, a main storage device 506, a supplemental storage device 507, and an input/output (I/O) interface 508. Further, an input device 503, such as a keyboard 509 and a pointing device 510, and an output device 504, such as a printer 511 and a display device 512 are provided as peripheral equipment 502.

The CPU 505 used in the present invention controls the overall operation of the computer and executes desired processing on the basis of an operation system, programs, and so on, stored in ROM 513 and RAM 514. Any kind of CPU on a general purpose computer may be used.

The main storage device 506 is configured with the ROM 513 and the RAM 514, for instance, and stores the operation system, programs, and operation result, for instance.

As the supplemental storage device 507, there are a hard disk, a magneto-optical disk, CD-ROM, and a floppy disk, for instance; however, the present invention is not limited to these, and the present invention includes any kinds of storage media capable of storing and providing programs of the present invention and operation results for a long time, and any combinations thereof.

Further, an external storage device which is connected to the computer main body 501 via the I/O interface 508 may be used instead.

The I/O interface 508 is provided for connecting to the keyboard 509, the pointing device 510, the printer 511, the external storage device, a network, and so on, and usually provided within the computer main body 501. Further, the program of the present invention may be installed from a storage medium onto the computer, or loaded down from a storage device at a remote location via a network.

As the input device 503, the keyboard 509 is used for inputting character information to the computer main body 501. Further, a mouse and a track ball, for instance, are used as the pointing device 510 for designating a point on the display device 512.

As for the output device 504, the display device 512 and the printer 511 are major devices. There are a couple of available types of display devices, and a CRT and a LED may be used as the display device 512. A display device of any other type may be used as far as it is possible to display operation results of the computer, responses to queries, internal information, input information, and so on, using characters and images. A touch panel display device, which can be also used as the input device, may be used.

As for the printer 511, a laser printer and an ink jet printer are preferably used.

<Configuration of Processes>

Next, an example of a configuration of processes is explained with reference to FIG. 6.

In a solar cell module information acquisition process 601, information, such as a product name, type, and dimensions of a solar cell module, interval to be taken to connect to another solar cell module, type and position of a connector, maximum output voltage, open voltage, output current, output power, and method of installation of the solar cell module, are acquired. The information may be inputted from the input device 503, such as the keyboard 509, when necessary; however, since the information is often repeatedly used, it is preferable to make a database of the information and store it in a storage medium. In such a case, necessary information is read from the database in the solar cell module information acquisition process 601. The database may be generated using an available software and a maintenance program, for instance.

In an installation surface information acquisition process 602, dimensions and installable area of an installation surface where solar cell modules are installed are acquired. If the installation surface is a roof, information on a direction from ridge to eaves (slope) is needed. Further, when inputting the dimensions of the roof on the basis of a blueprint called a roof plan, the angle of slope of the roof is also needed as the information.

In the process 602, information of a figure rendered on the display device 512, angle information, and value information may be acquired using the pointing device 510 and the keyboard 509; however, the information may be stored in a storage medium in advance, and loaded down from the storage device to the RAM 514. Further, it is also possible to acquire information on the dimensions by storing a standard figure of an installation surface in a storage medium and changing parameters of the figure.

In an installation condition acquisition process 603, information, such as method of installation, start position of installation, intervals between solar cell modules, shift amount between adjoining lines of solar cell modules, method of arrangement from a reference position, and name of the module to be installed, are acquired. It is convenient to set initial values of the information in a database and a program in advance and change those values on the display device 512 when necessary. An installation position of each solar cell module is calculated on the basis of the installation conditions acquired in the process 603.

In an installation information calculation process 604, the installation position of each solar cell module is calculated on the basis of the information and conditions acquired in the processes 601, 602 and 603 using an installation algorithm. The resultant installation position may be outputted in an installation information output process 605 each time the installation position is calculated; however, it is effective to make an installation position table to cope with changing the information and/or conditions, and output thereafter on the basis of the installation position table.

Further, the number of solar cell modules to be installed is also calculated in the process 604.

As for the algorithm used in the process 604, there are a method, as shown in FIG. 29, of calculating installation positions of solar cell modules 2901 while filling an installable area 2903 from the left or right side and a method of calculating installation positions of solar cell modules 2901 on the center area of an installation surface 2902 or the installable area 2903. Referring to FIG. 29, reference numeral 2904 denotes the area where no solar cell module is installed although the area 2904 is within the installable area 2903. Note, in FIGS. 29 to 33B, the same elements are referred to by the same reference numerals, and explanation of them are omitted hereinbelow.

In the latter method, installation positions may be determined on the basis of the center of each row (or string) of solar cell modules connected in series as shown in FIG. 30; however, in consideration of a case where the installation surface and the installable area is asymmetry with respect to the center line, solar cell modules are arranged by groups, each including a plurality of rows of solar cell modules. In FIG. 30, reference numeral 3001 denotes a reference line (or the center line).

FIG. 31 shows a case of grouping a plurality of rows (strings) so that the same number of solar cell modules can be arranged on each row and arranging the groups based on a row (string), in each group, having the smallest non-installable area on its right and left sides. Referring to FIG. 31, reference numerals 3101, 3102 and 3103 denote reference lines (or center lines).

In a case where solar panel roofing board modules are used, joint portions of the modules are often shifted right or left alternately by row for weathering. In this case, if the shift direction is invariably altered, there would be cases where the joint portions continues in two adjoining rows as shown by reference 3202 in FIG. 32A or the positions of joint portions irregularly appear as shown by reference 3203 and 3204 in FIG. 32B at the border of rows (strings) which include different numbers of modules. To overcome these problems, by changing the order of alternation as shown in FIGS. 33A and 33B, it is possible to prevent the joint portions from being succeeded over two rows or irregularity of joint portions ruining the appearance. In FIGS. 32A, 32B, 33A and 33B, reference numeral 3201 denotes a reference line (or a center line), and references A, B and C denote groups of solar panel roofing board modules.

Referring to FIG. 6 again, in the installation information output process 605, information calculated in the process 604 is outputted to the printer 511, the display device 512, and/or the storage device. As already described above, the information on arrangement of solar cell modules calculated in process 604 may be outputted each time the installation position of each solar cell module is calculated; however, when the installation position table is generated in the process 604, the displaying of the information may be performed on the basis of the data of the installation position table. From the printer 511 and the display device 512, the information is outputted as an image in which images of solar cell modules are arranged on an image of a roof.

In a designated solar cell module information acquisition process 606, an identification number and a position, for instance, of a solar cell module are acquired for deleting or rearranging the solar cell module. For manually selecting a module, it is preferable to make a user select an image of a corresponding solar cell module displayed on the display device 512 using the pointing device 510; however, any configuration can be used as far as the ID and position of the solar cell module can be selected. When it is determined that an arranged solar cell module has to be deleted as a result of an electric connection candidate calculation process 609 (will be explained later), a solar cell module satisfying the conditions for being deleted is searched for using the installation position table.

In an additional solar cell module information acquisition process 607, the type of a solar cell module to be added, and a position to be added are designated. The position of the additional solar cell module may be selected using the pointing device 510 or designated with reference to other solar cell modules which are already arranged.

In an installation information changing process 608, the contents of the generated installation position table in accordance with a predetermined algorithm.

In the electric connection candidate calculation process 609, candidates of the numbers of columns and rows of the solar cell modules on the basis of the number of modules calculated in the arrangement information calculation process 604 in accordance with a predetermined algorithm.

In an optimum electric connection calculation process 610, the optimum arrangement is selected from the candidates of the numbers of the columns and rows of the solar cell modules calculated in the process 609. Generally, the arrangement in which the number of solar cell modules is the closest to the allowable number of solar cell modules and the largest number of solar cell modules are connected in series is selected.

Next, embodiments of the present invention having the aforesaid configuration will be explained below.

<First Embodiment>

Figure 7:
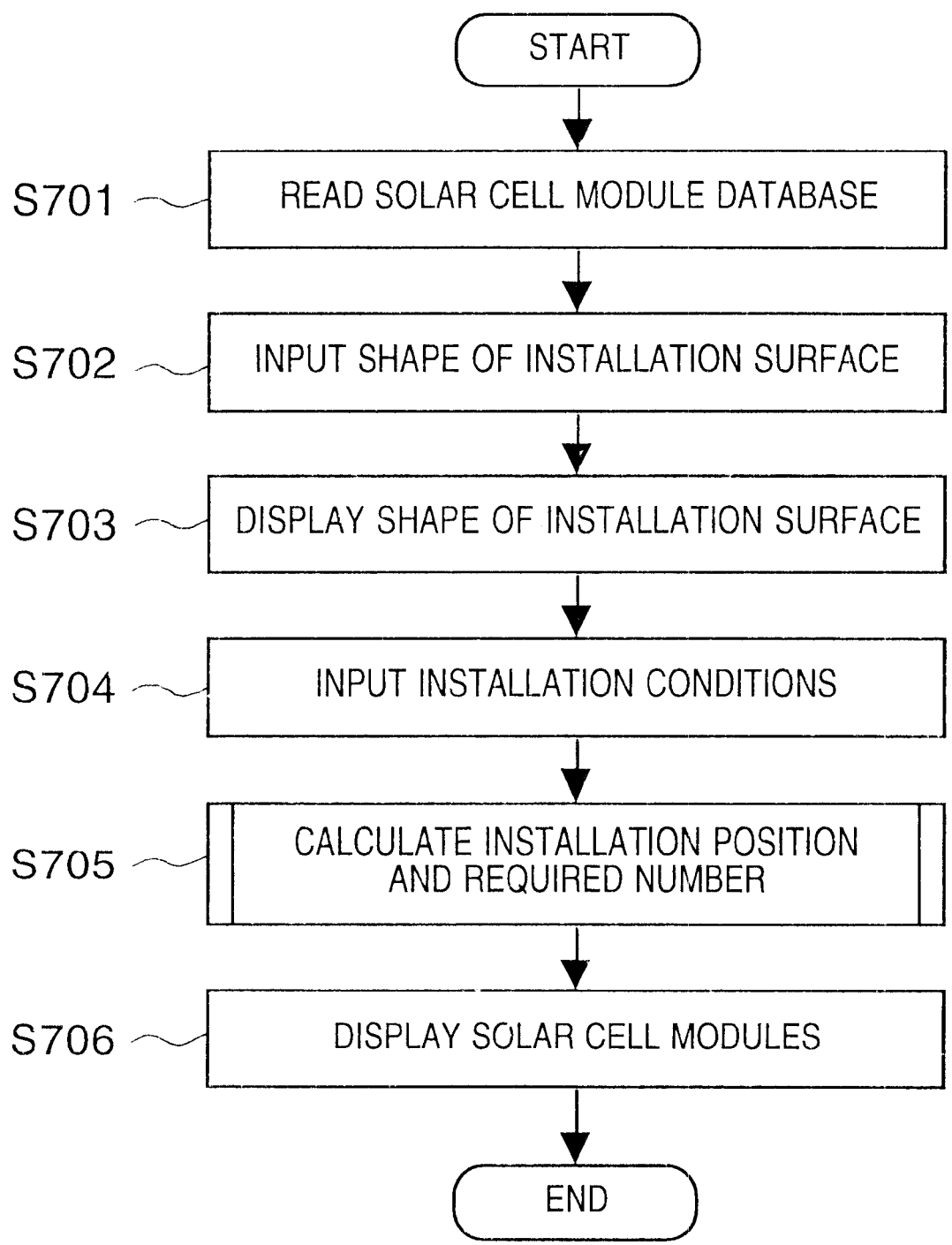
FIG. 7 is a flowchart showing an operation sequence according to a first embodiment of the present invention.

FIG. 7 is a flowchart showing an operation sequence according to the first embodiment of the present invention.

Figure 6:
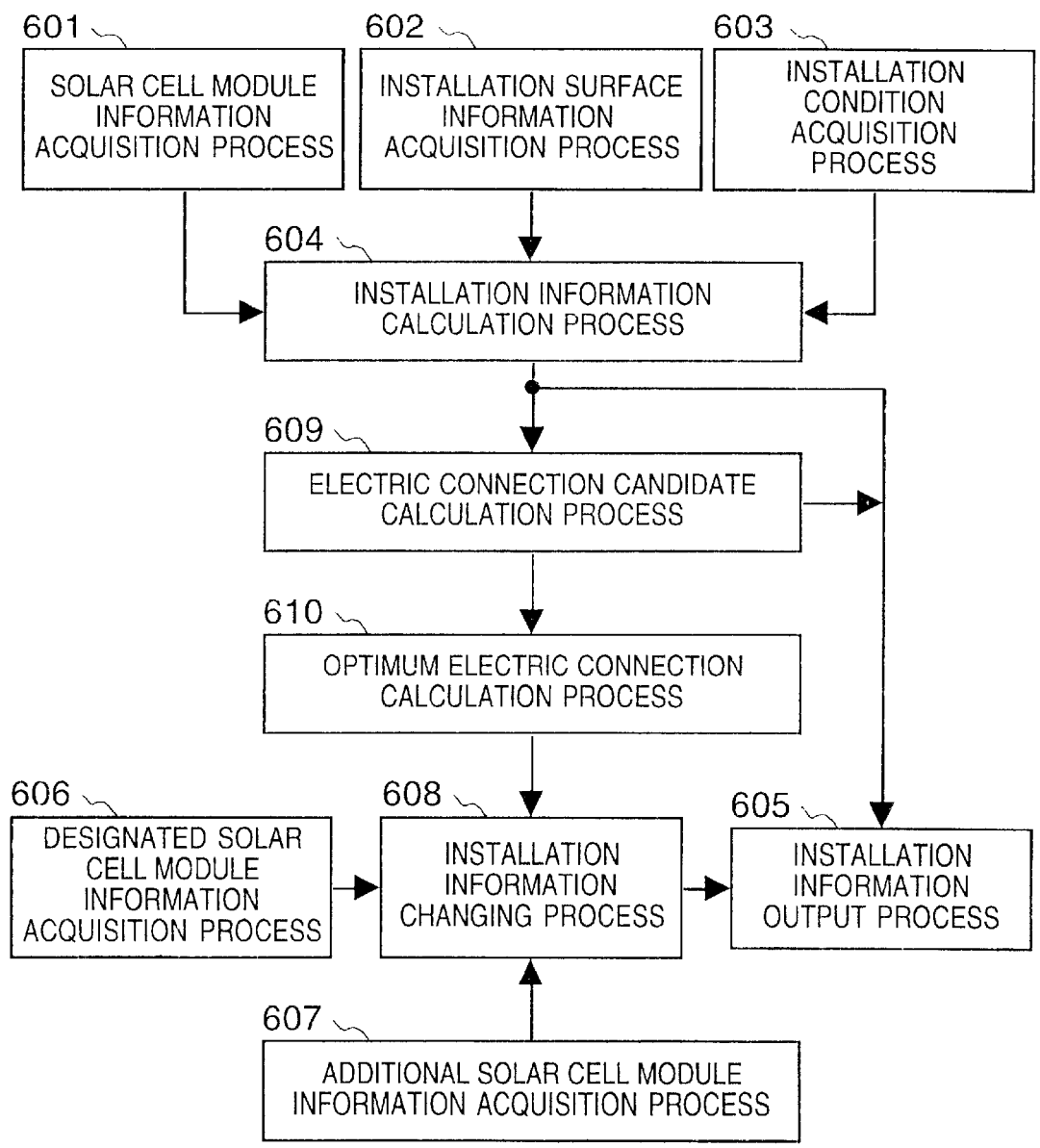
FIG. 6 is a block diagram showing a program configuration of the present invention.

According to the program of the first embodiment, a solar cell module database is read in step S701 in correspondence with the solar cell module information acquisition process 601 shown in FIG. 6.

According to the first embodiment, data of solar cell modules are registered in advance in the solar cell module database. As for the data of the solar cell modules, product names of the solar cell modules as roofing materials, effective length, working width, interval to be taken between solar cell modules, and types of the roofing materials, for instance, are registered in advance. A reference value of the interval is predetermined for each roofing material, and the reference value is positive when the modules are arranged apart from each other, whereas the reference value is negative when the modules overlap each other. Further, information indicative of whether or not the interval can be changed is registered in a changeable/fixed field. As types of roofing materials, stepping roof type and batten seam roofing type are registered in the first embodiment. In step S701, the foregoing data is read out and stored it in the RAM 514.

Figure 8:
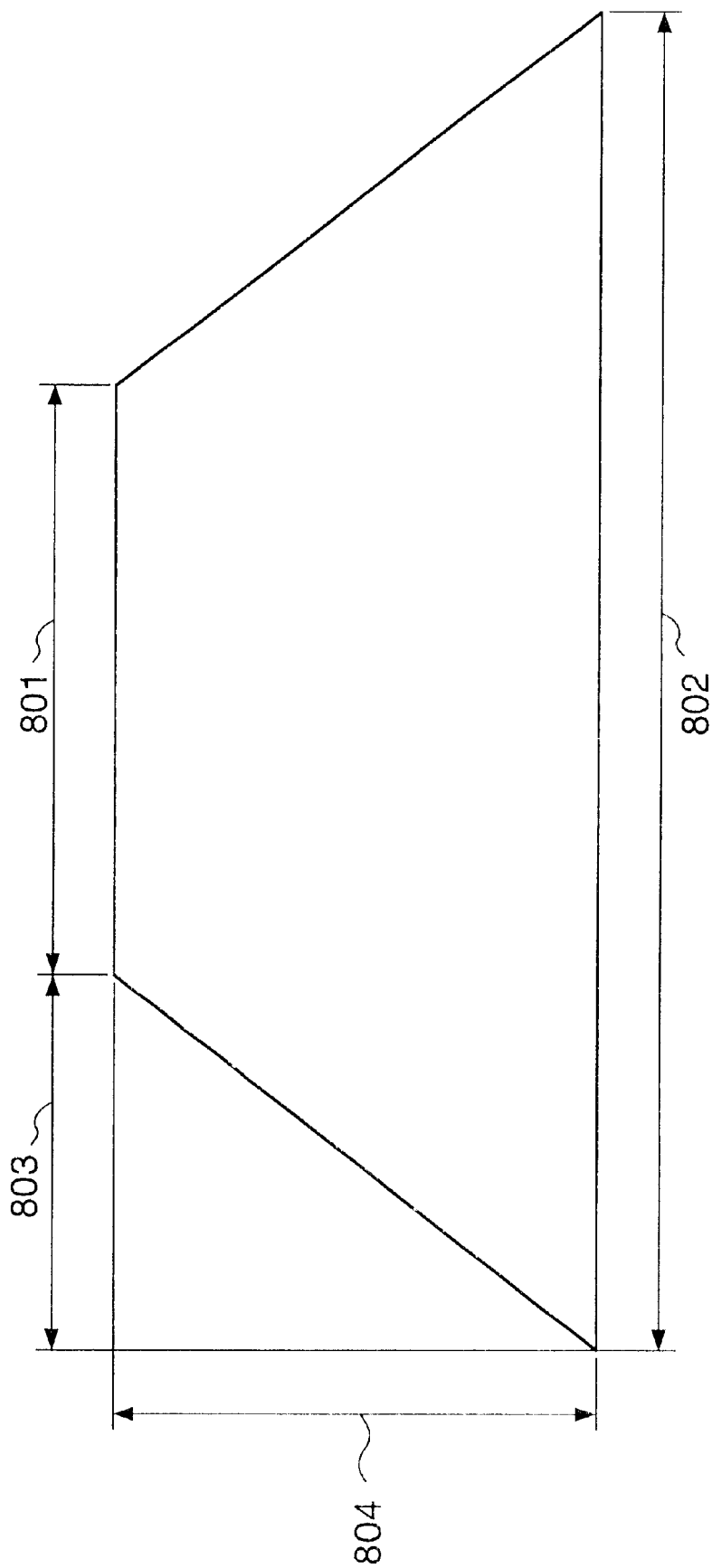
FIG. 8 is an explanatory view for explaining an input method of information on an installation surface according to the first embodiment of the present invention.

Further, a shape of an installation surface is inputted in step S702 in correspondence with the installation surface information acquisition step 602 in FIG. 6. In step S702, a roof surface of a building is considered as a trapezoid as shown in FIG. 8, and a top side 801, a bottom side 802, a shift amount 803 of the top side 801 and the bottom side 802 in the horizontal direction, and a height 804 are inputted. In this input method, by setting the top side 801 equal to the bottom side 802 and setting the shift amount to 0, a rectangle is inputted, and by setting the top side 801 being 0 and the shift amount being greater than 0, a triangle is inputted, further, by setting the top side 801 equal to the bottom side 802 and the shift amount 803 is not 0, a parallelogram is inputted, besides the trapezoid as shown in FIG. 8. Thus, it is possible to input shapes of a gable roof and a hip roof, which are general roof types often adopted in a residence. The shape of the roof surface is represented by coordinates of start and end points of each side as internal data according to the first embodiment; however, the internal data may have any other format as far as the shape is expressed.

Further, by designating the area where no solar cell module should be provided on a roof as a distance from each side, the area where solar cell modules can be installed (e.g., the installable area 302 in FIG. 3) is determined. After the shape of the installation surface is inputted in step S702, the shape of the installation surface is displayed on the display device 512 in step S703, thereby an operator can confirm the shape of the installation surface.

As for the installation condition acquisition process 603, installation conditions are inputted in step S704. According to the program of the first embodiment, intervals between solar cell modules, product name of the solar cell module as a roofing board, installation method, and the start position of the installation are inputted. After these data are inputted, the process proceeds to step S705, which corresponds to the installation information calculation process 604 in FIG. 6, where an installation position of each solar cell module is calculated.

Figure 10:
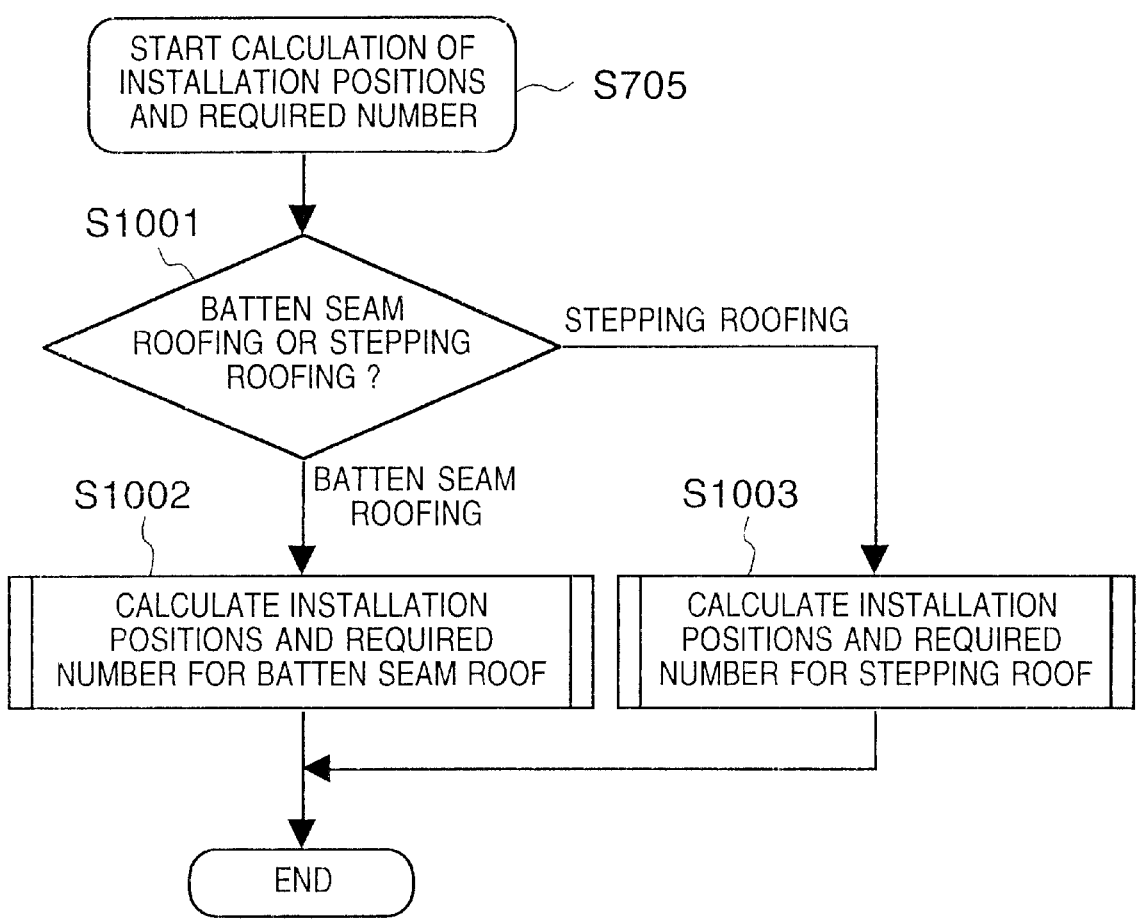
FIG. 10 is a flowchart of an operation of an installation position calculation process shown in FIG. 7.
Figure 11:
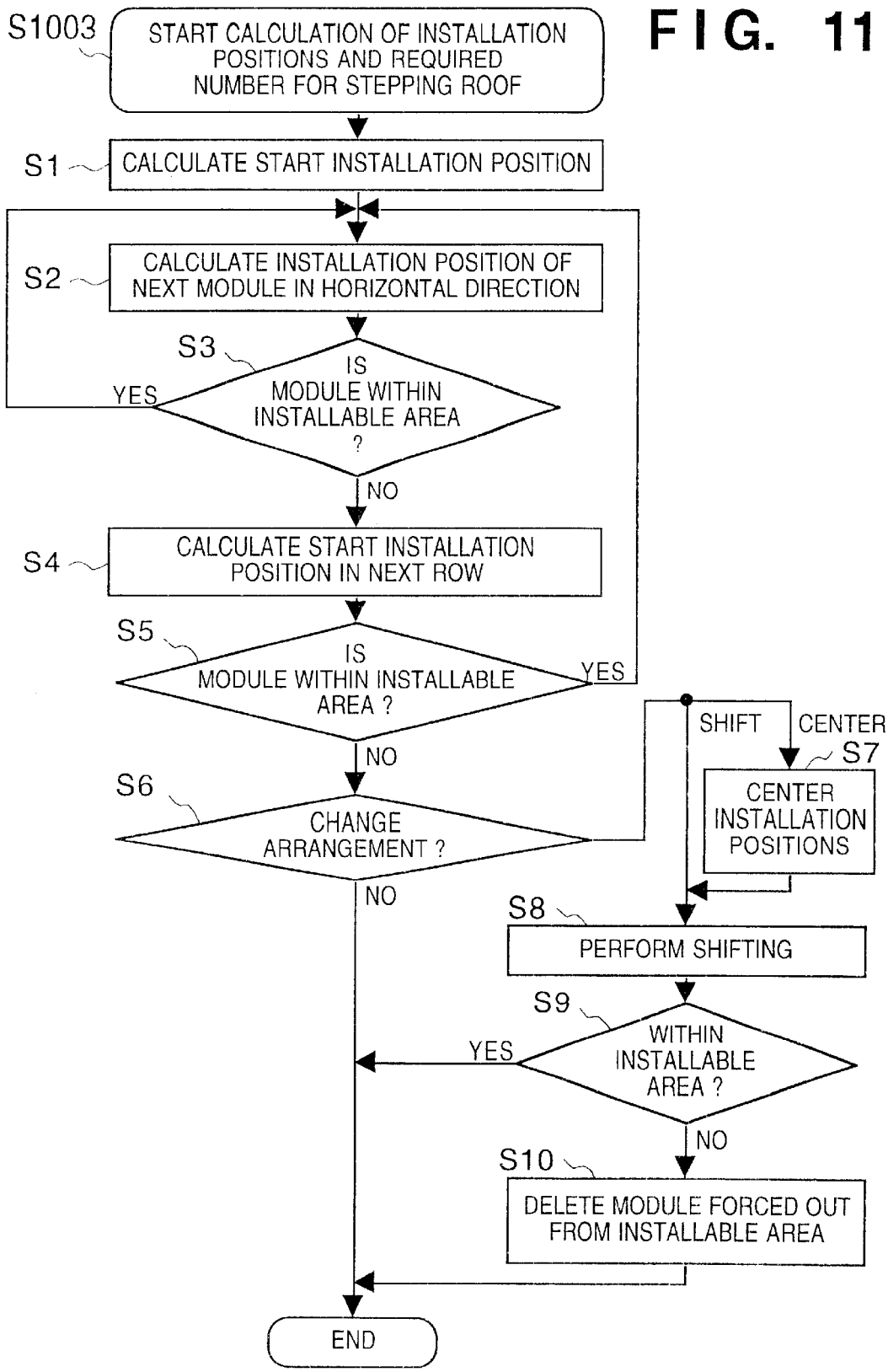
FIG. 11 is a flowchart of an operation of an installation position calculation process of solar cell modules on a stepping roof shown in FIG. 10.

In step S705 in the first embodiment, processing shown by a flowchart in FIG. 10 is performed, and installation positions and the number of required roofing boards (i.e., solar cell modules) to be installed on a roof are calculated under the conditions inputted in step S704. In the example shown in FIG. 10, either batten seam roofing or stepping roofing is selected, and, when the batten seam roofing is selected, then installation positions and the number of required roofing boards (solar cell modules) to be installed on the batten seam roof are calculated in step S1002, whereas, when the stepping roofing is selected, then installation positions and the number of required roofing boards (solar cell modules) to be installed on the stepping roof are calculated in step S1003.

First, a case where roofing boards for stepping roofing are selected and arranged on a trapezoid roof of a hip roof from the lower leftmost position of the roof (corresponds to step S1003 in FIG. 10) is explained with reference to FIGS. 9 to 13.

Figure 9:
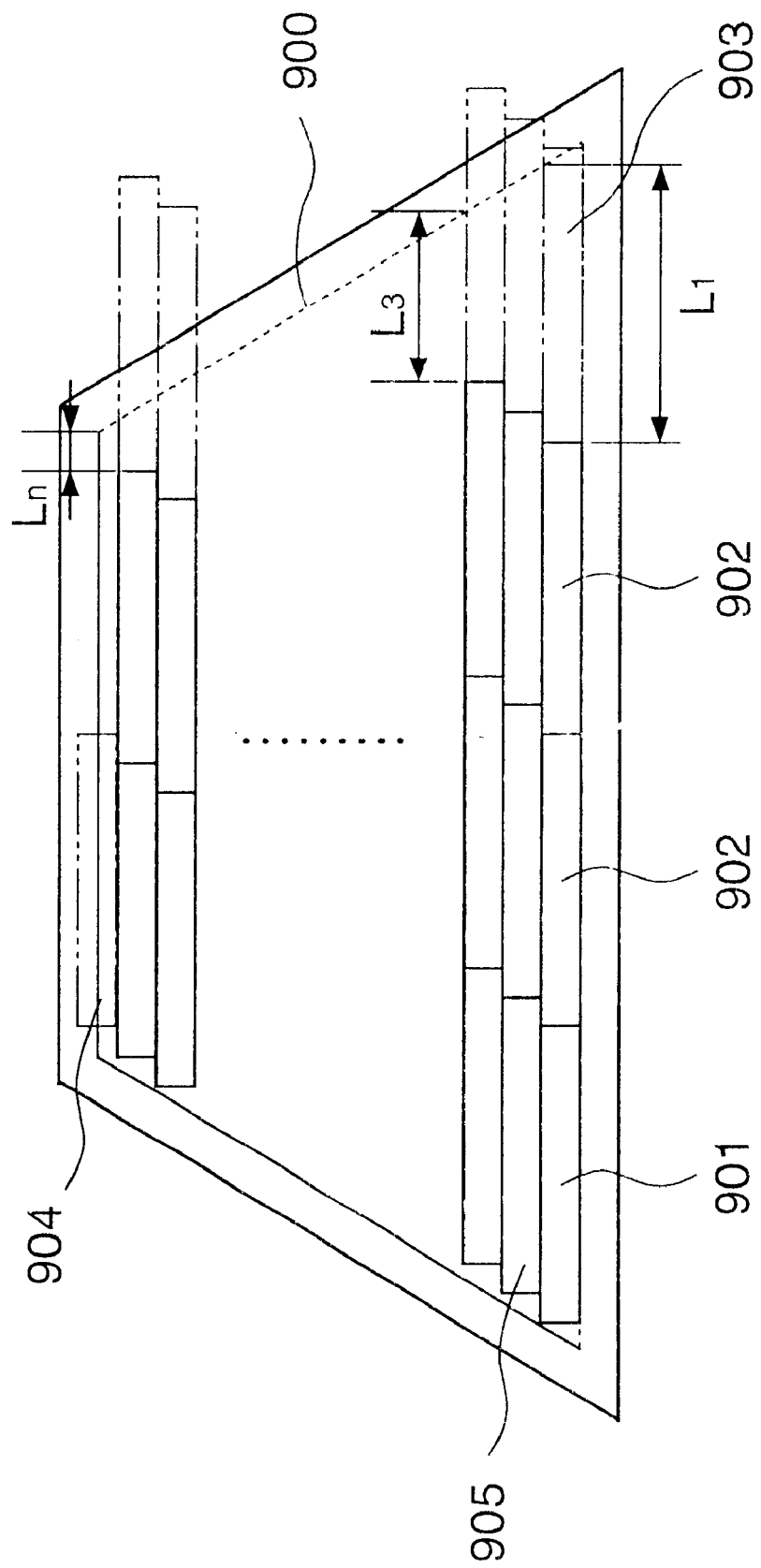
FIG. 9 is a view showing an arrangement of solar cell modules according to the first embodiment of the present invention.

In step S1, a lower leftmost position in an installable area 900 of an installation surface where a solar cell module 901 can be set as shown in FIG. 9 is calculated. Thereafter, in step S2, an installation position of another solar cell module 902 next to the solar cell module 901 in the horizontal direction is calculated, and in step S3, whether or not the solar cell module 902 is within the installable area 900 is determined. If yes, the positions of the solar cell modules 901 and 902 are stored, a counter for counting the number of solar cell modules is increased by one, then the process returns to step S2. The aforesaid processes are repeated, and when at least a part of a solar cell module which is set next to the previous one in the horizontal direction can not be fit within the installable area 900 (the state of a solar cell module 903 in FIG. 9, and No in step S3), the position of the solar cell module 903 is not stored and the process proceeds to step S4. In step 54, a leftmost position in the next upper row for a solar cell module 905 is calculated. Then, in step S5, whether the solar cell module crosses the upper limit of the installable area 900 or not is determined (i.e., the state of a solar cell module 904 in FIG. 9). If the solar cell module is within the installable area 900, then the process returns to step S2 and the processes of steps S2 to S5 are repeated. When the solar cell module passes the upper limit of the installable area 900, then arrangement of solar cell modules is terminated.

Figure 12:
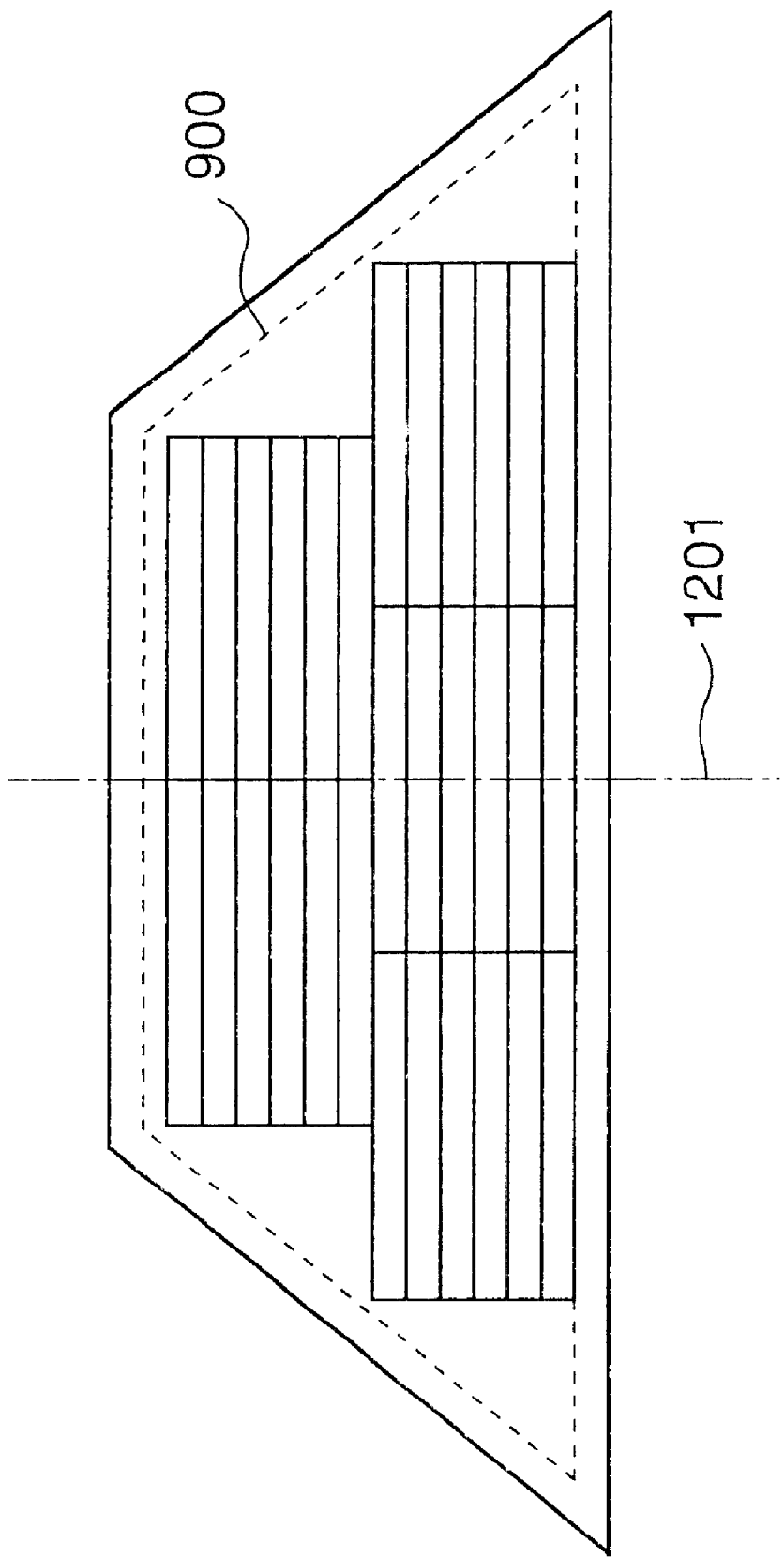
FIG. 12 is a view showing another arrangement of the solar cell modules according to the first embodiment of the present invention.

By arranging solar cell modules in the aforesaid manner, the solar cell modules are packed from the left side to the right. In step S6, whether or not it is desired to change the installation positions of the solar cell modules is determined, and if not, the process is terminated. Whereas, if it is desired to center the solar cell modules as shown in FIG. 12, then the positions of the solar cell modules are changed so that they are centered by each row (step S7). More specifically, the length in rows where no solar cell module is arranged (L1 to Ln in FIG. 9) within the installable area 900 is calculated, and one half of the calculated length is added on the both right and left sides of the solar cell modules in each row. In FIG. 12, reference numeral 1201 denotes a reference line (center line).

Figure 13A:
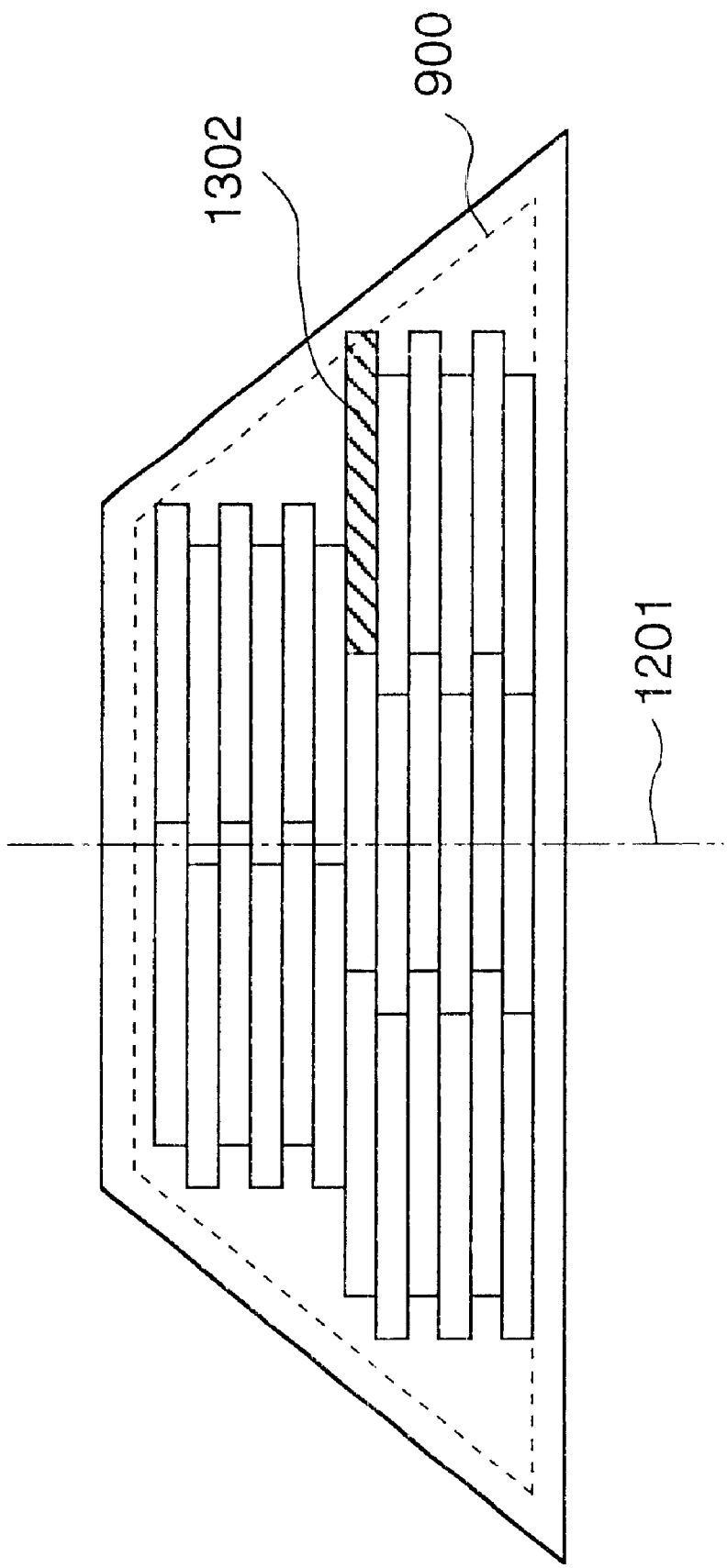
FIG. 13A is a view showing another arrangement of the solar cell modules according to the first embodiment of the present invention.
Figure 13B:
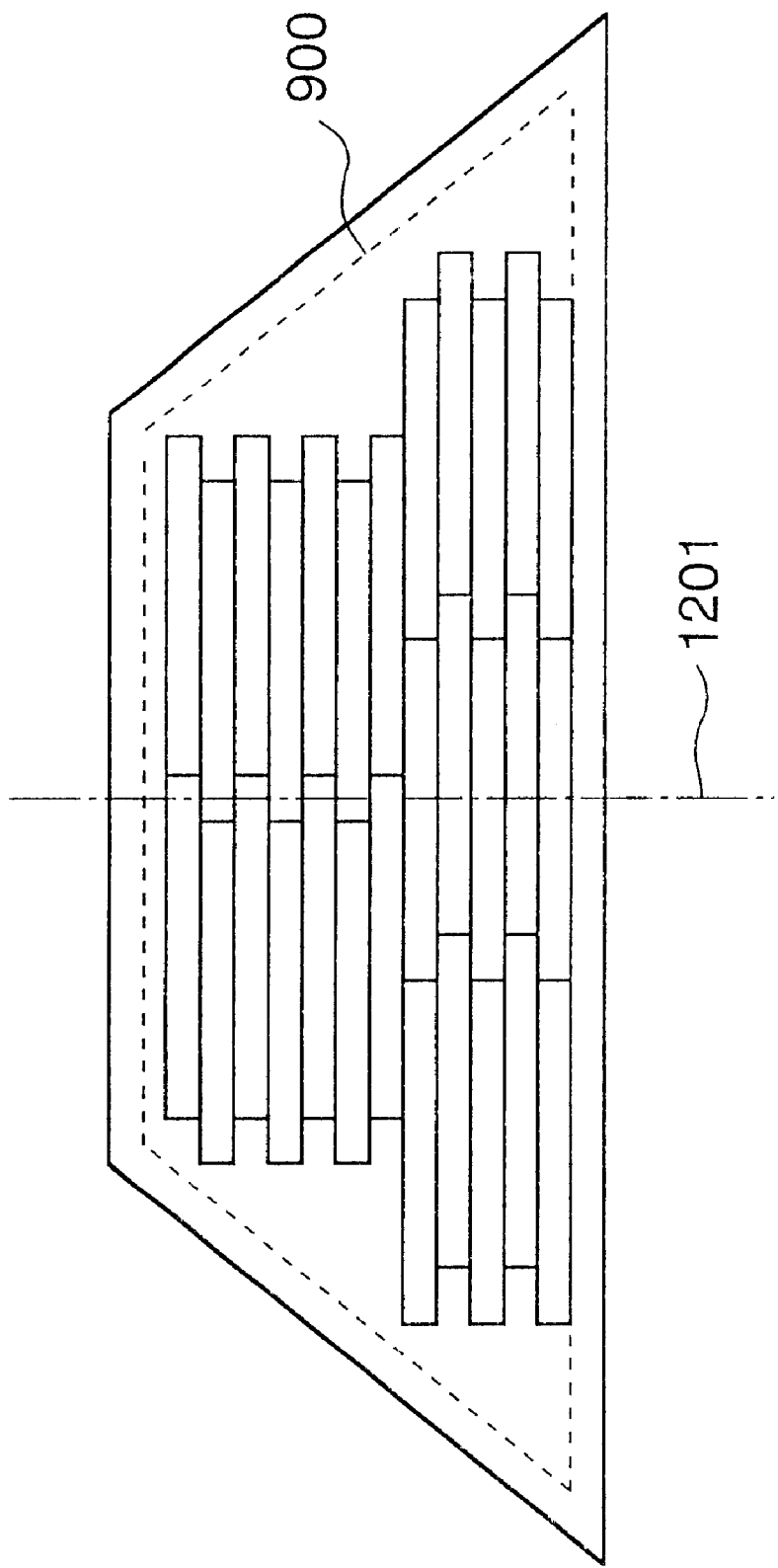
FIG. 13B is a view showing an adjusted arrangement of the arrangement of the solar cell modules shown in FIG. 13A.

Further, if it is desired to shift the joint portions of the solar cell modules as shown in FIGS. 13A and 13B, the solar cell modules are shifted either to the right or left by rows on the basis of information on a shift amount and period. By designating the shift amount as 0, the shift process is not performed.

As a result of performing the shift process, if the length in a row where no solar cell module is installed within the installable area is shorter than the shift amount, a solar cell module 1302 is forced out from the installable area 900 as shown in FIG. 13A (No in step S9). In this case, the solar cell module 1302 forced out from the installable area 900 is deleted as shown in FIG. 13B in step S10.

Next, a case where roofing boards for batten seam roofing are selected and arranged on a trapezoid roof of a hip roof from the lower leftmost position of the roof (corresponds to step S1002 in FIG. 10) is explained with reference to FIGS. 15 to 18.

Figure 16:
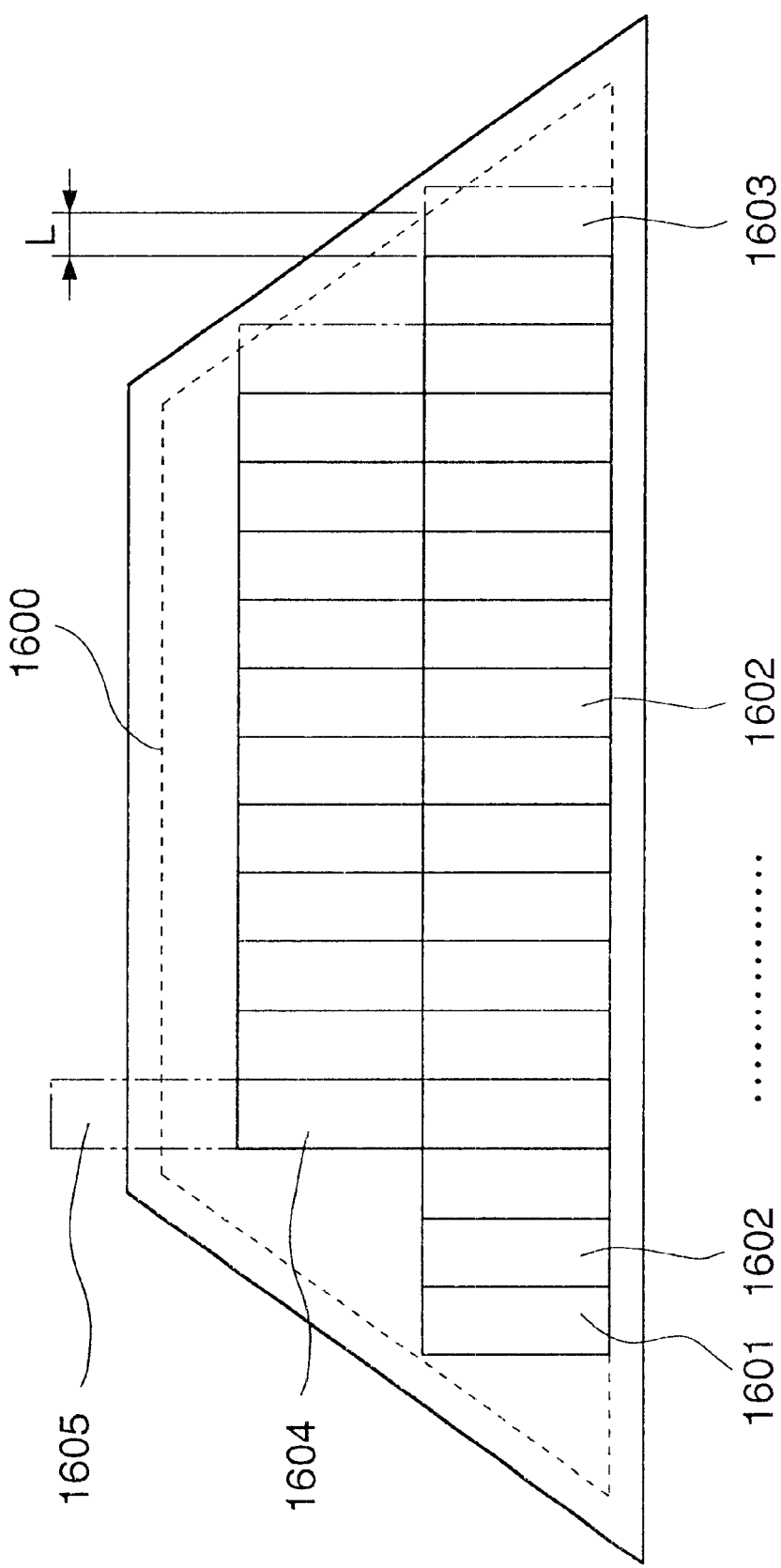
FIG. 16 is a view showing an arrangement of solar cell modules according to the first embodiment of the present invention.

In step S21, a lower leftmost position in an installable area 1600 of an installation surface where a solar cell module 1601 can be set as shown in FIG. 16 is calculated. Thereafter, in step S22, an installation position of another solar cell module 1602 next to the solar cell module 1601 in the horizontal direction is calculated, and in step S23, whether or not the solar cell module 1602 is within the installable area 1600 is determined. If yes, the positions of the solar cell modules 1601 and 1602 are stored, a counter for counting the number of solar cell modules is increased by one, then the process returns to step S22. The aforesaid processes are repeated, and when at least a part of a solar cell module which is set next to the previous one in the horizontal direction can not be fit within the installable area 1600 (the state of a solar cell module 1603 in FIG. 16, and No in step S23), the position of the solar cell module 1603 is not stored and the process proceeds to step S24. In step S24, a leftmost position in the next upper row for a solar cell module 1604 is calculated. At this time, the solar cell in the next upper row is arranged so as to be aligned to the solar cell in the lower row. Then, in step S25, whether the solar cell module crosses the upper limit of the installable area 1600 or not is determined (i.e., the state of a solar cell module 1605 in FIG. 16). If the solar cell module is within the installable area 1600, then the process returns to step S22 and the processes of steps S22 to S25 are repeated. When the solar cell module pass es the upper limit of the installable area 1600, then arrangement of solar cell modules is terminated.

Figure 17:
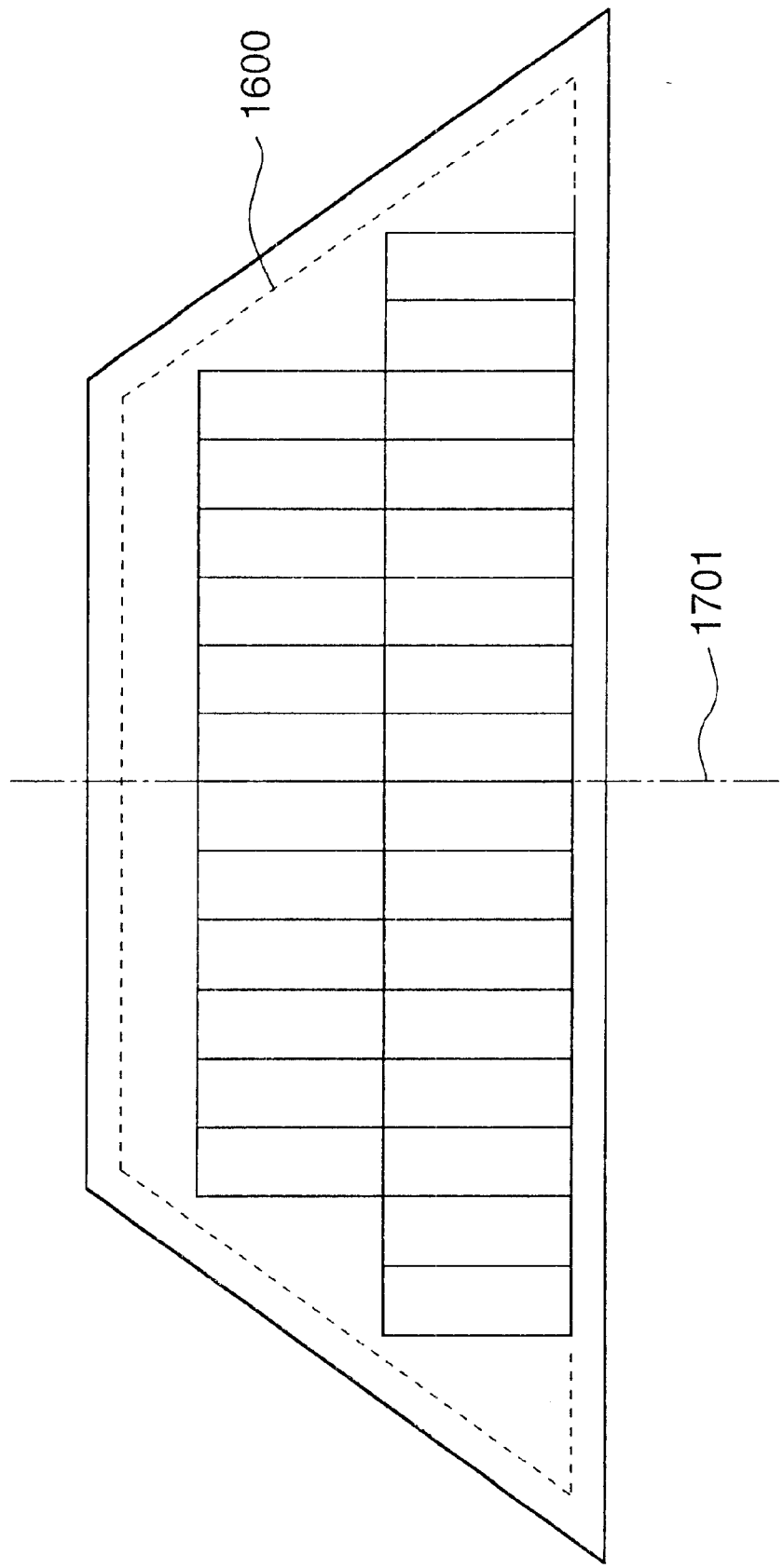
FIG. 17 is a view showing another arrangement of the solar cell modules according to the first embodiment of the present invention.

By arranging solar cell modules in the aforesaid manner, the solar cell modules are packed from the left side to the right. In step S26, whether or not it is desired to change the installation positions of the solar cell modules is determined, and if not, the process is terminated whereas, if it is desired to center the solar cell modules as shown in FIG. 17, then the positions of the solar cell modules are changed so that they are centered by each row (step S27). More specifically, a length where no solar cell module is arranged within the installable area 1600 in the lowest row (L) is calculated, and one half of the calculated length is added on the both right and left sides of the solar cell modules in the lowest row. In FIG. 17, reference numeral 1701 denotes a reference line (center line).

In the first embodiment, the solar cell modules in the lowest row are centered, and the solar cell modules in the upper rows are rearranged with reference to the installation positions of the solar cell modules in the lowest row; however, the present invention is not limited to this, and a process of designating a row to be referenced may be added.

Figure 18:
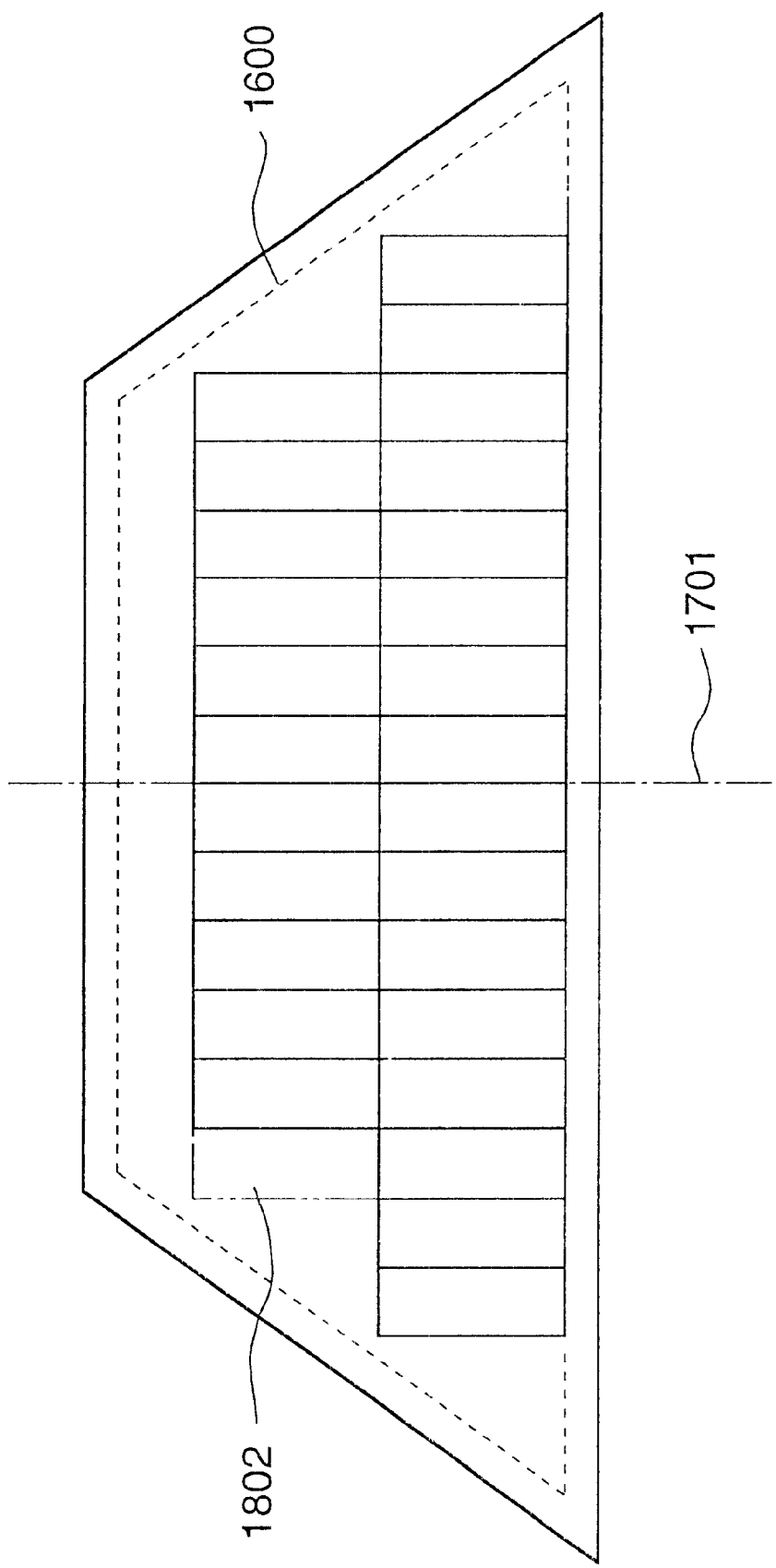
FIG. 18 is a view showing an adjusted arrangement of the arrangement of the solar cell modules shown in FIG. 17.

When such a centering is performed, there may be cases where another solar cell module can be added within the installable area 1600 as shown in FIG. 18 or a solar cell module can not be fit within the installation area 1600. In these cases, an additional solar cell module 1802 may be added in the installable area 1600 in step S31 as shown in FIG. 18 in the former case or a solar cell module which is not fit within the installable area 1600 is deleted in step S29 in the latter case.

The installation positions of the solar cell modules are calculated as above, and the obtained result is additionally displayed on the image of the installation surface which has been already displayed on the display device 512 in step S706 in FIG. 7.

Further, the acquired installation information may be stored in a storage device and printed out by the printer 511 in response to a user designation.

Figure 14:
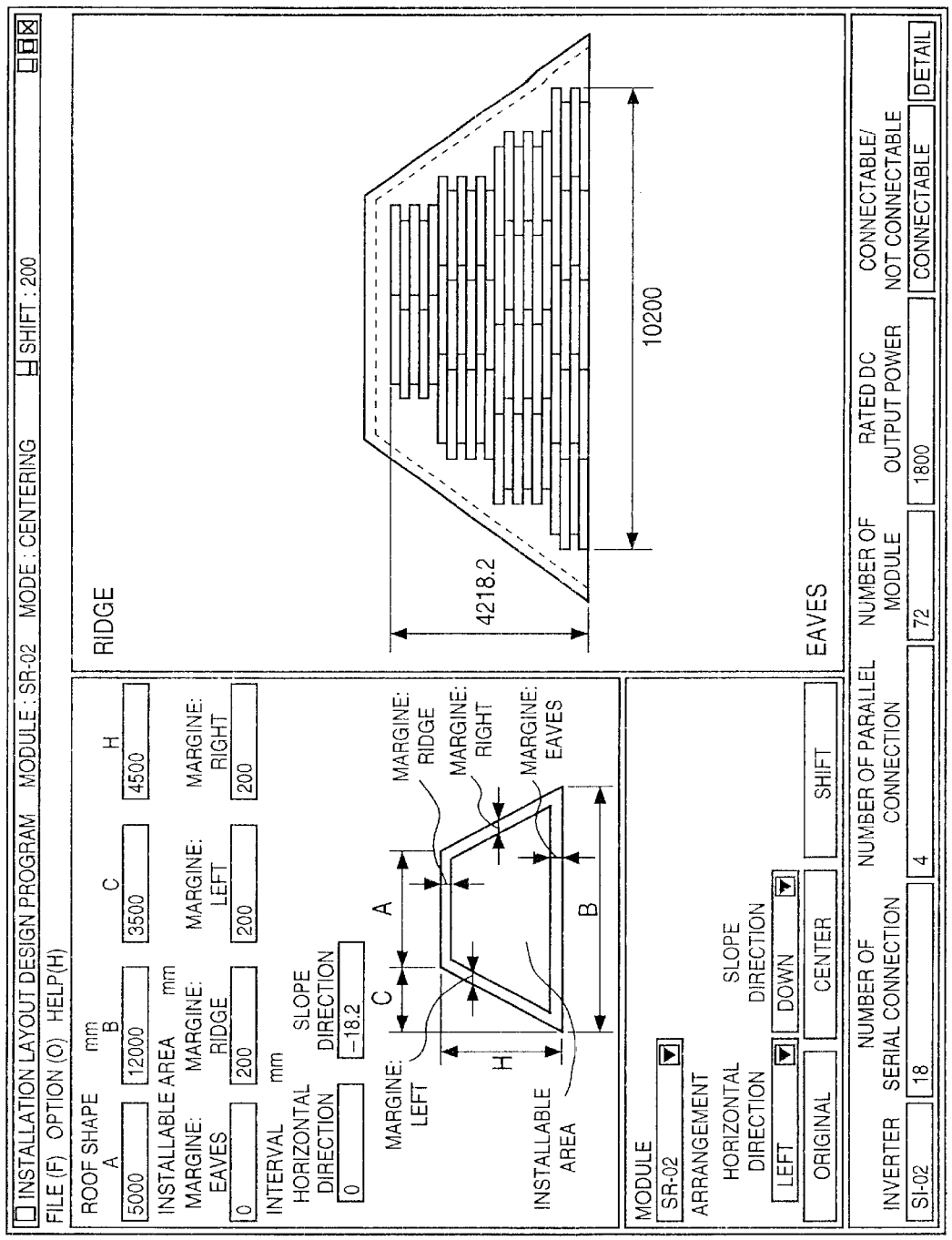
FIG. 14 shows an image displayed on a monitor in a case of arranging solar cell modules on a stepping roof according to the first embodiment of the present invention.
Figure 15:
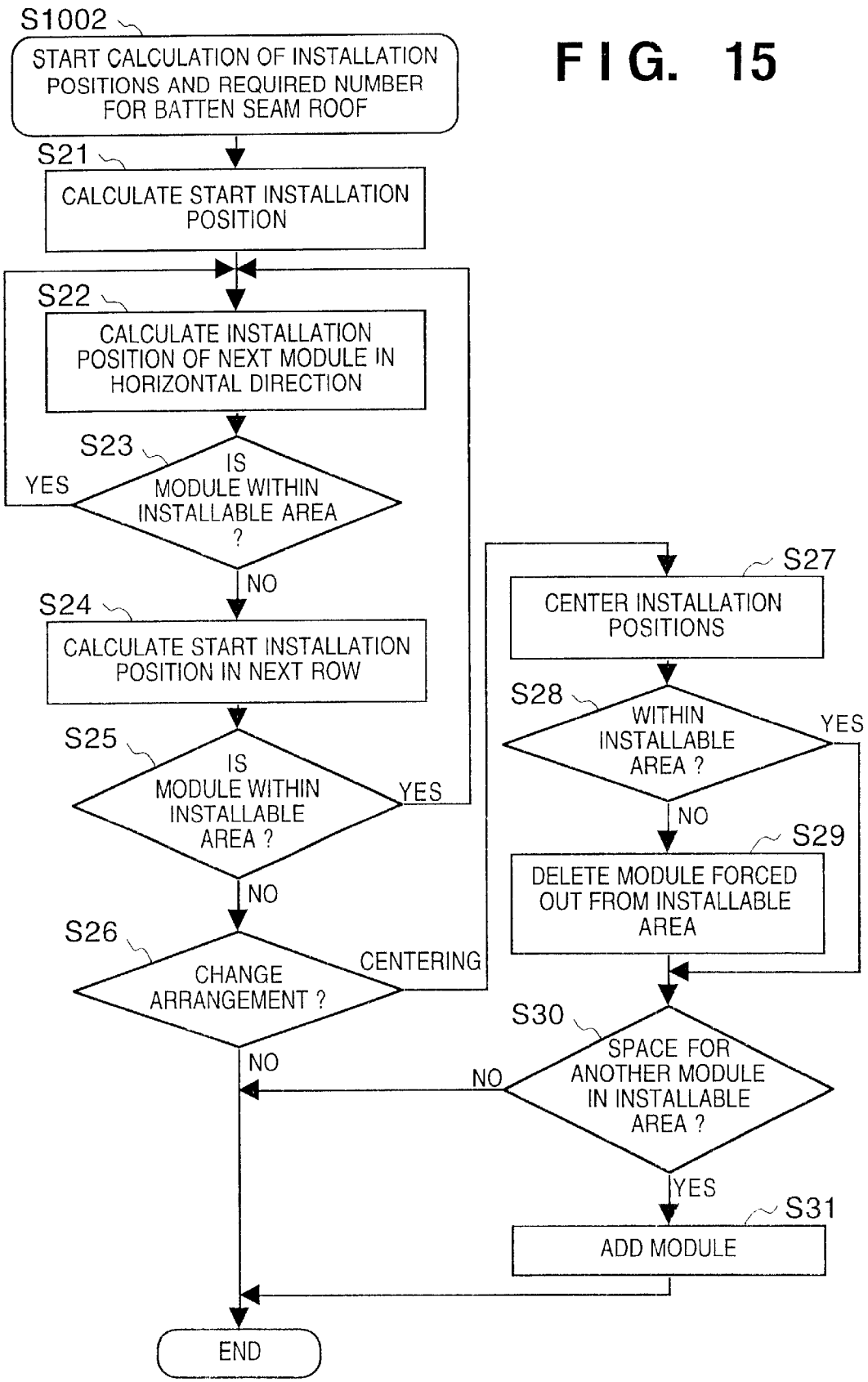
FIG. 15 is a flowchart of an operation of an installation position calculation process of solar cell modules on a batten seam roof shown in FIG. 10.
Figure 19:
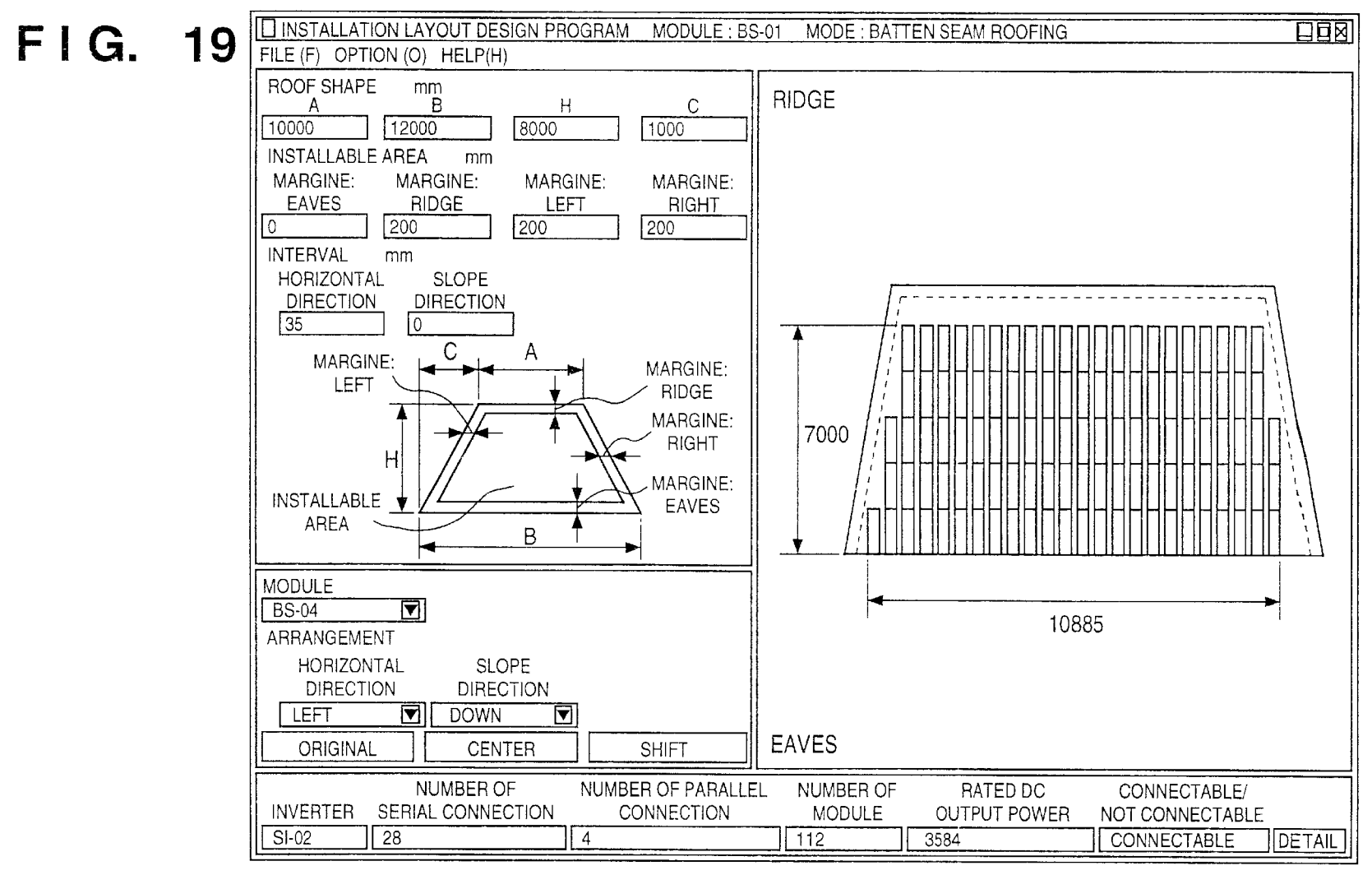

In the first embodiment, a program which operates on the Windows 95™ available from Microsoft Corporation is made. FIGS. 14 and 19 show examples of resultant outputs acquired by executing the program according to the first embodiment.

In the computer program product according to the first embodiment as described above, installation positions of solar cell modules on an installation surface are automatically calculated on the basis of inputted installation conditions, a shape of the installation surface, and information on a solar cell module to be installed, and the resultant arrangement drawing is outputted, which can be used at the job site thereby improving efficiency of the installation work.

Further, the required number of solar cell modules to be installed is also automatically obtained, which helps to make a cost estimate.

It should be noted that the processes are explained with reference to flowcharts in the first embodiment, however, the order of the input and operation processes may be changed arbitrary so long as no problem is caused by changing the order.

<Second Embodiment>

Next, the second embodiment of the present invention will be explained.

Figure 20:
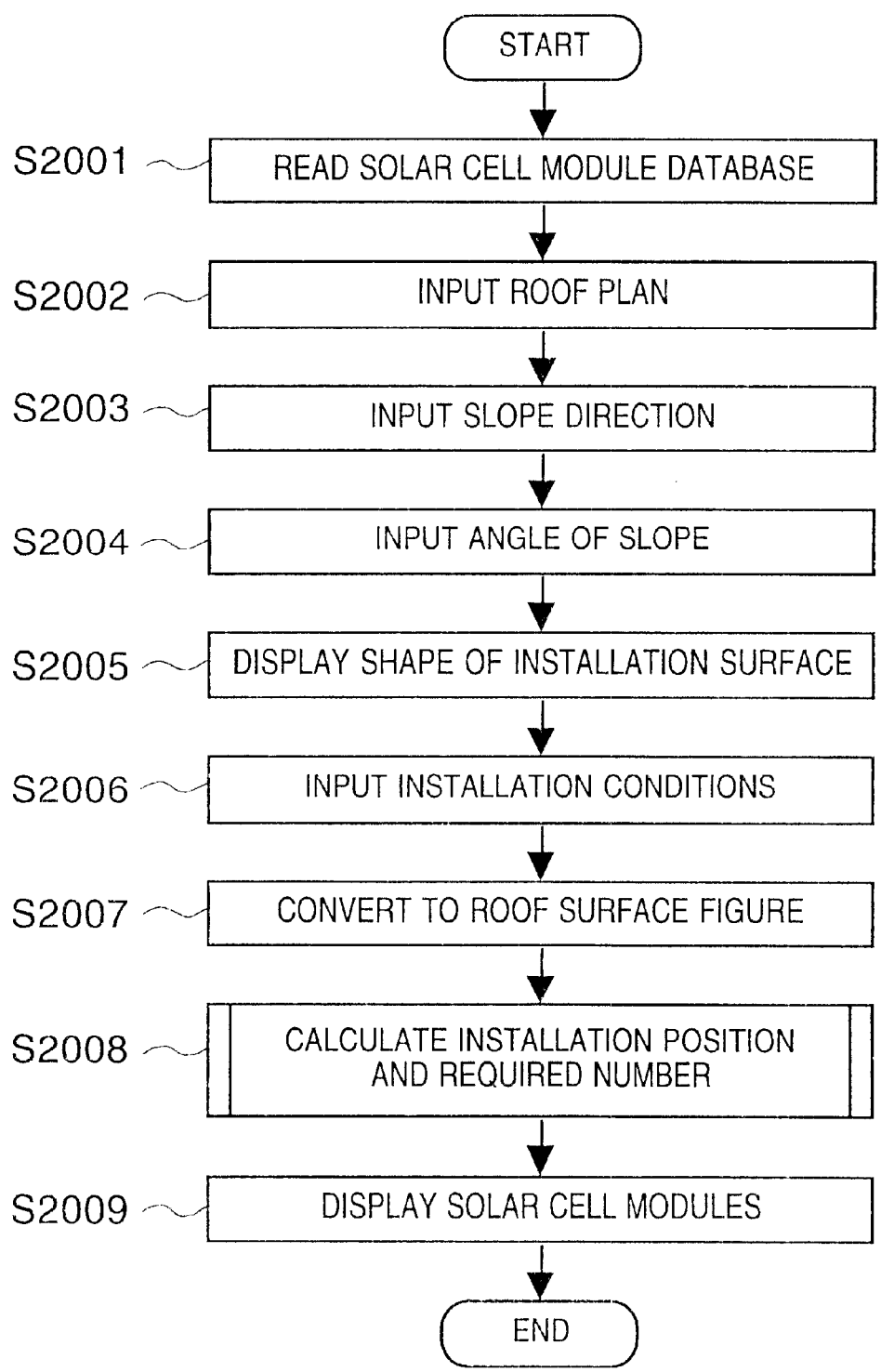
FIG. 20 is a flowchart showing an operation sequence according to a second embodiment of the present invention.

FIG. 20 is a flowchart showing an operation of the second embodiment of the present invention.

In the second embodiment, in consideration that a projection drawing of a roof, called roof plan, is generally used in a design drawing, a program enabling to automatically arrange solar panel roofing board modules on a roof in accordance with dimensions used in the roof plan is explained.

In the program of the second embodiment, a solar cell module database is read in step S2001 in correspondence with the solar cell module information acquisition process 601 shown in FIG. 6, similarly to the first embodiment. The solar cell module database has the same configuration as described in the first embodiment.

Further, in correspondence with the installation surface information acquisition process 602, a roof plan is inputted in step S2002, the slope direction is inputted in step S2003, and the angle of the slope is inputted in step S2004.

Figure 21:
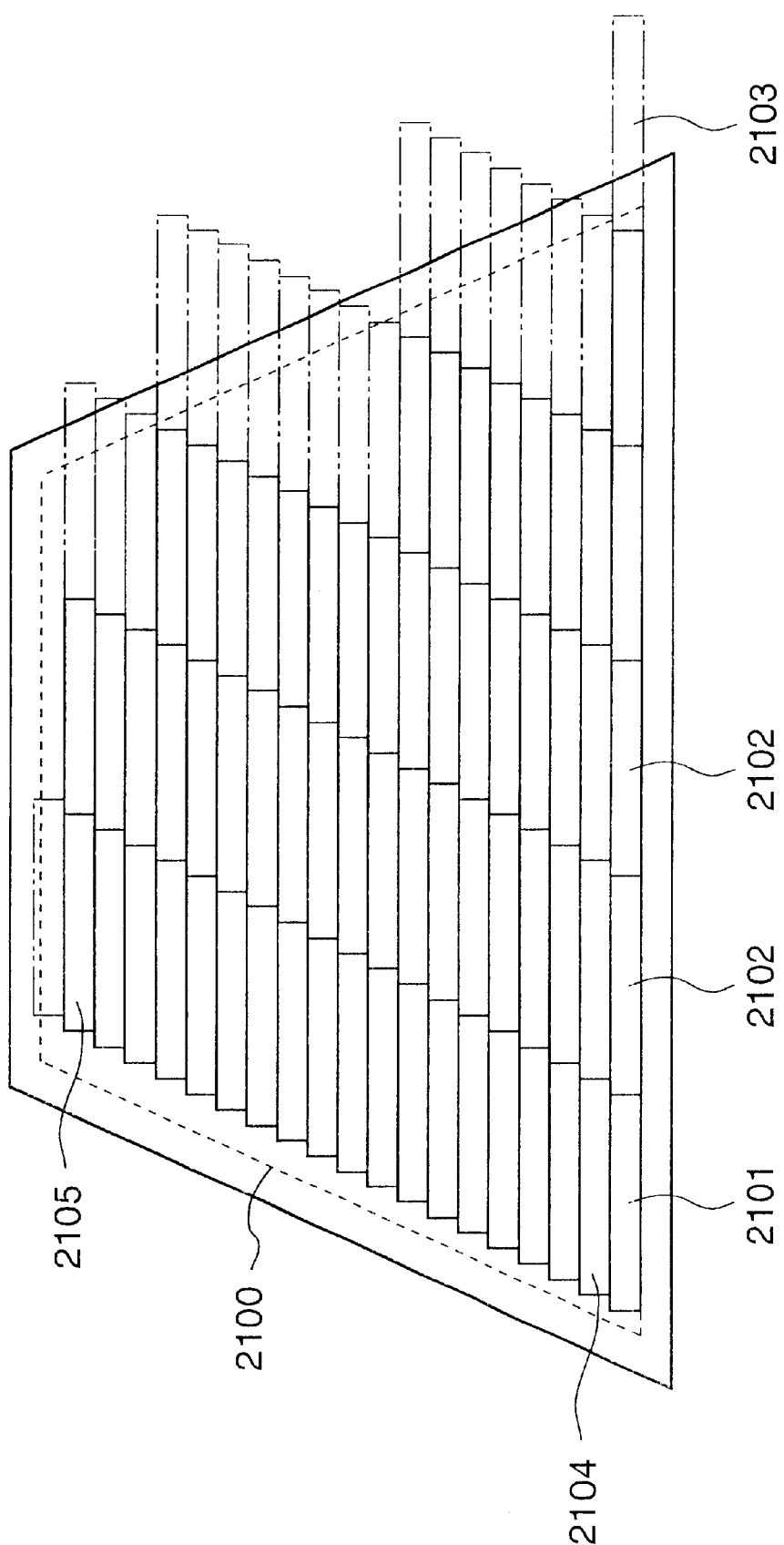
FIG. 21 is a view showing an arrangement of solar cell modules according to the second embodiment of the present invention.

In step S2002, the roof plan of a roof of a building is inputted by roof surfaces of trapezoid shape as shown in FIG. 21. Further, by inputting the area where no solar cell module should be installed on the roof surface as a distance from each side, the area where solar cell modules can be installed (installable area) is determined. After inputting the roof plan, the shape of the installation surface may be displayed on the display device 512 so that an operator can confirm the shape.

In step S2003, the slope direction of the steepest slope of the roof is inputted. In the second embodiment, in consideration of the type of the input shape and the angle of the slope of a roof of a residence, either upward or downward can be designated. Further, in step S2004, the angle of the slope of the roof is inputted. In the field of architecture, for expressing the angle, since units other than degree are often used, the program is made so as to cope with those units.

After the shape and other information on the installation surface are obtained in steps S2001 to S2004, an image of the installation surface is displayed on the display device 512 in step S2005.

Further, installation conditions are inputted in step S2006 in accordance with the installation condition acquisition process 603. In the program of the second embodiment, intervals between solar cell modules, product name of the solar cell module as a roofing board, installation method, and the start position of the installation are inputted.

After these data are inputted, a process corresponding to the installation information calculation process 604 in FIG. 6 is performed.

First, in step S2007, the roof plan is converted to a roof surface figure on the basis of information of the slope direction and the angle of the slope inputted in steps S2003 and S2004. In the second embodiment, since the slope direction is fixed along the y axis (i.e., upward or downward), if the slope is defined as s:10 (height:distance) and vertices of a trapezoid are (x1, y1), (x2, y2), (x3, y3), and (x4, y4), for instance, all of the y coordinates are converted in accordance with a following equation, $$y' = y \times 1/\cos(\tan^{-1}(s/10))$$

and become to (x1, y1'), (x2, y2'), (x3, y3'), and (x4, y4').

If the reference line is tilted, then x-y coordinates are rotated so that the reference line becomes parallel to the x axis or the y axis, thereafter, the aforesaid conversion is performed.

Then, the installation position of each solar cell module on the converted installation surface and the required number of the solar cell modules are calculated in step. S2008 in such manner as described with reference to FIG. 10 under the conditions inputted in the previous steps.

Next, a case where roofing boards (solar cell modules) for stepping roofing are selected and arranged on a trapezoid roof of a hip roof so that the joint portions of the roofing boards are shifted by one half of the length of the roofing board and centered is explained with reference to FIGS. 11 and 21 to 23.

In step S1, a lower leftmost position in an installable area 2100 of an installation surface where a solar cell module 2101 can be set as shown in FIG. 21 is calculated. Thereafter, in step S2, an installation position of another solar cell module 2102 next to the solar cell module 2101 in the horizontal direction is calculated, and in step S3, whether or not the solar cell module 2102 is within the installable area 2100 is determined. If yes, the positions of the solar cell modules 2101 and 2102 are stored, a counter for counting the number of solar cell modules is increased by one, then the process returns to step S2. The aforesaid processes are repeated, and when a part of a solar cell module which is set next to the previous one in the horizontal direction can not be fit within the installable area 2100 (the state of a solar cell module 2103 in FIG. 21, and No in step S3), the position of the solar cell module 2103 is not stored and the process proceeds to step S4. In step S4, a leftmost position in the next upper row for a solar cell module 2104 is calculated. Then, in step S5, whether the solar cell module crosses the upper limit of the installable area 2100 or not is determined (i.e., the state of a solar cell module 2105 in FIG. 21). If the solar cell module is within the installable area 2100, then the process returns to step S2 and the processes of steps S2 to S5 are repeated. When the solar cell module passes the upper limit of the installable area 2100, then arrangement of solar cell modules is terminated.

By arranging solar cell modules in the aforesaid manner, the solar cell modules are packed from the left side to the right. In step S6, whether or not it is desired to change the installation positions of the solar cell modules is determined, and if not, the process is terminated. Whereas, if it is desired to shift the solar cell modules, first, the positions of the solar cell modules are changed so that they are centered by each row (step S7). More specifically, the length in each row where no solar cell module is arranged within the installable area 2100 is calculated, and one half of the calculated length is added on the both right and left sides of the solar cell modules in each row.

Thereafter, shifting operation for shifting the solar cell modules to right and left by rows is performed (step S8).

Figure 22A:
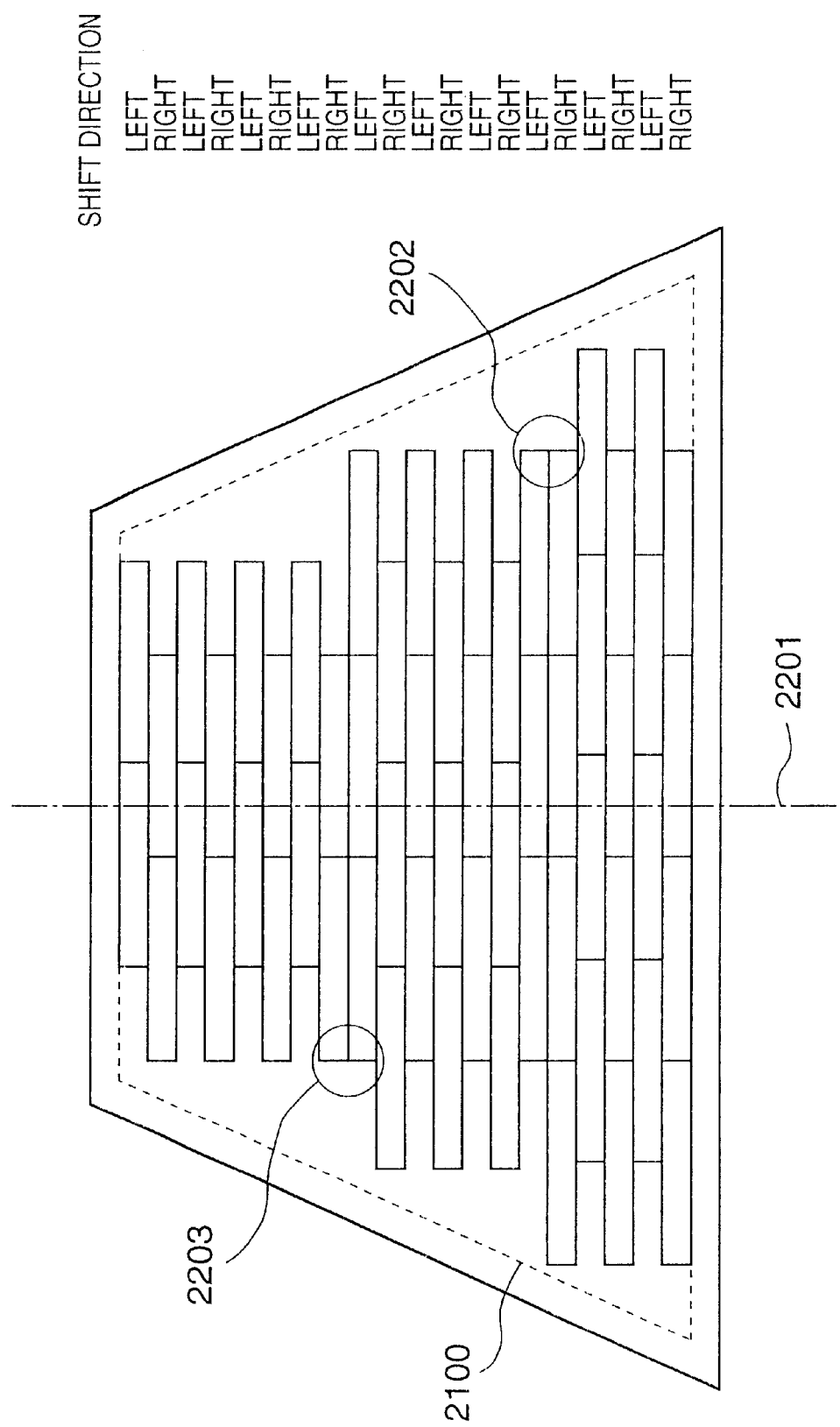
FIG. 22A is a view showing another arrangement of solar cell modules according to the second embodiment of the present invention.
Figure 22B:
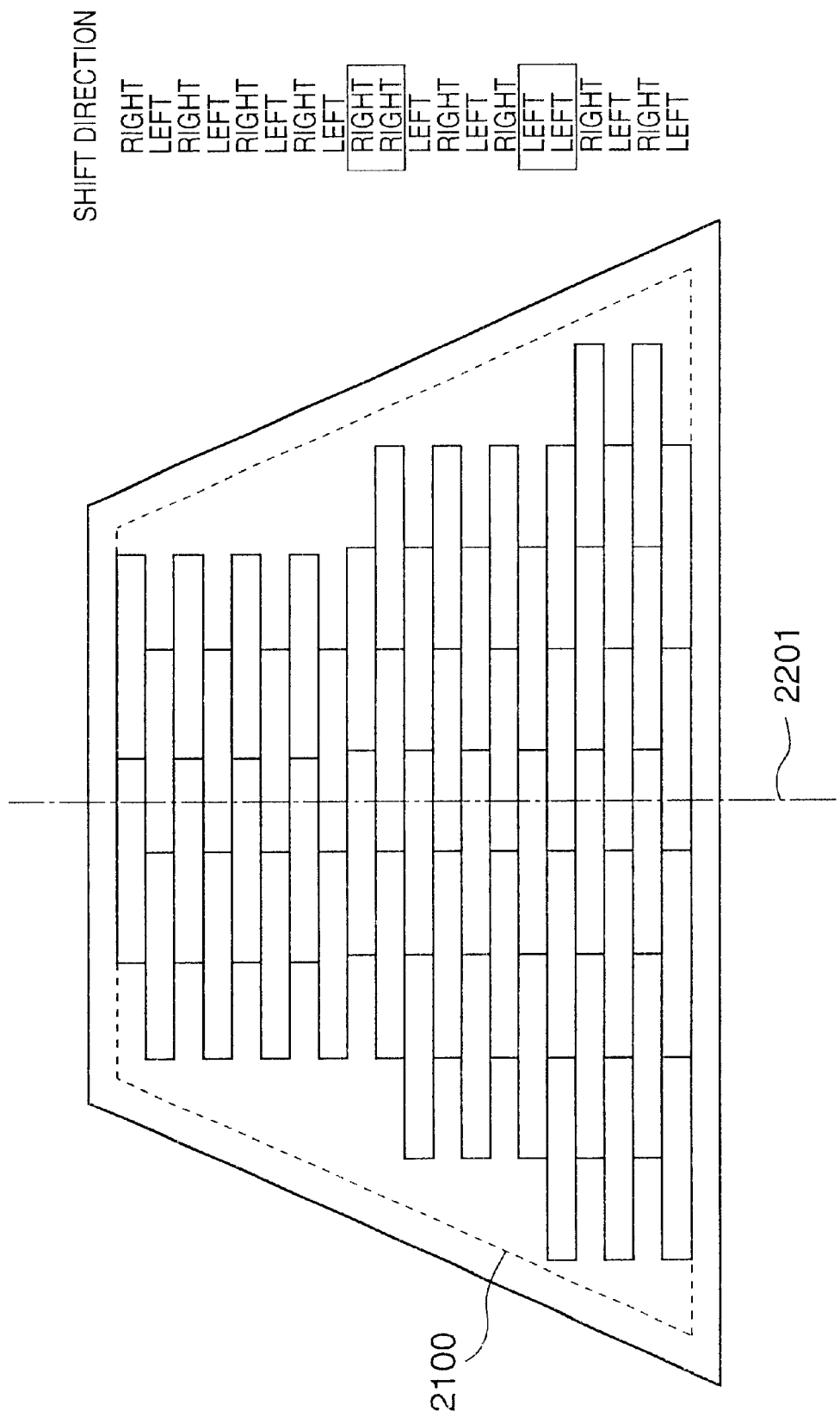
FIG. 22B is a view showing an adjusted arrangement of the arrangement of the solar cell modules shown in FIG. 22A.

If the shift direction is invariably altered, there is a possibility that the joint portions continues in two adjoining rows as shown by references 2202 and 2203 in FIG. 22A at the border of rows (strings) which include different numbers of modules to each other. Accordingly, in the program of the second embodiment, when the numbers of solar cell modules in two adjoining rows differ from each other, those adjoining rows shift in the same direction (i.e., the shift direction is not altered). By doing so, when the shift amount is a half length of a solar cell module, or when the shift amount is any other value (an example of an arrangement of solar cell modules is shown in FIG. 23), joint portions of solar cell modules do not continue in successive rows. In FIGS. 22A, 22B, and 23, reference numeral 2201 denotes a reference line (center line).

Further, similarly to the first embodiment, a solar cell module which does not fit within the installable area 2200 is deleted.

The installation positions of the solar cell modules are calculated as above, and the obtained result is additionally displayed on the image of the installation surface which is already displayed on the display device 512 in step S2009 in FIG. 20.

Further, the acquired installation information may be stored in a storage device and printed out by the printer 511 in response to a user designation.

In the second embodiment, similarly to the first embodiment, a program which operates on the Windows 95™ available from Microsoft Corporation is made.

According to the program of the second embodiment as described above, by inputting the shape of the roof by inputting a roof plan of a design drawing which is usually prepared in advance, it becomes unnecessary for an operator to convert a roof plan into a roof surface figure. Further, solar cell modules are automatically arranged on an installation surface by inputting installation conditions and information on the solar cell module and an image of the resultant arrangement is outputted, which can be used at the job site and improves efficiency of the installation work.

Further, the shift direction is changed at the border of rows (strings) which include different numbers of modules from each other, the program can cope with any shift amount.

Further, the required number of solar cell modules to be installed is also automatically obtained, which helps to make a cost estimate.

It should be noted that the processes are explained with reference to flowcharts in the second embodiment, however, the order of the input and operation processes may be changed arbitrary so long as no problem is caused by changing the order.

<Third Embodiment>

Next, the third embodiment of the present invention will be explained.

FIG. 24 is a flowchart of an operation of the third embodiment of the present invention.

The program of the third embodiment is for a case where it is necessary to consider electronic connection of the solar batteries.

In FIG. 24, the processes of steps S2001 to S2009 are the same as those of FIG. 20 explained in the second embodiment except step S2401, thus the explanation of them except step S2401 is omitted. It should be noted that the solar cell module database also has data of an output voltage, an open voltage, and output power of each solar cell module as characteristics of the solar cell module in addition to the contents explained in the first embodiment.

Further, an inverter database storing an allowable input voltage range and the maximum rated voltage of an electric equipment, such as an inverter, to be connected to the solar cell modules is provided. In the third embodiment, step S2001 of reading the solar cell module database as explained in the first embodiment and step S2401 of reading the inverter database correspond to the solar cell module information acquisition step 606.

Figure 25:
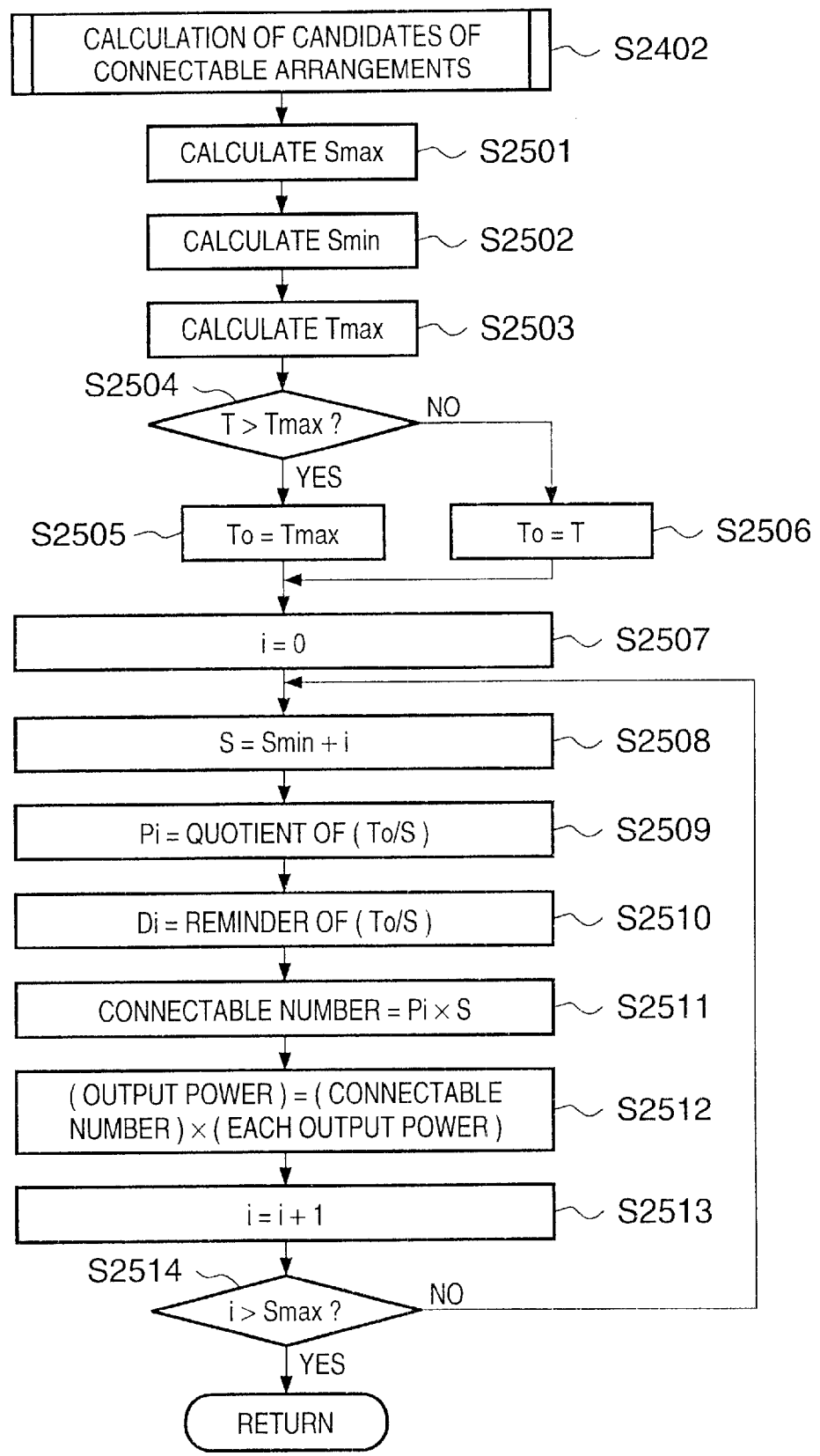
FIG. 25 is a flowchart of an operation of a connection candidate calculation process shown in FIG. 24.
Figure 27:
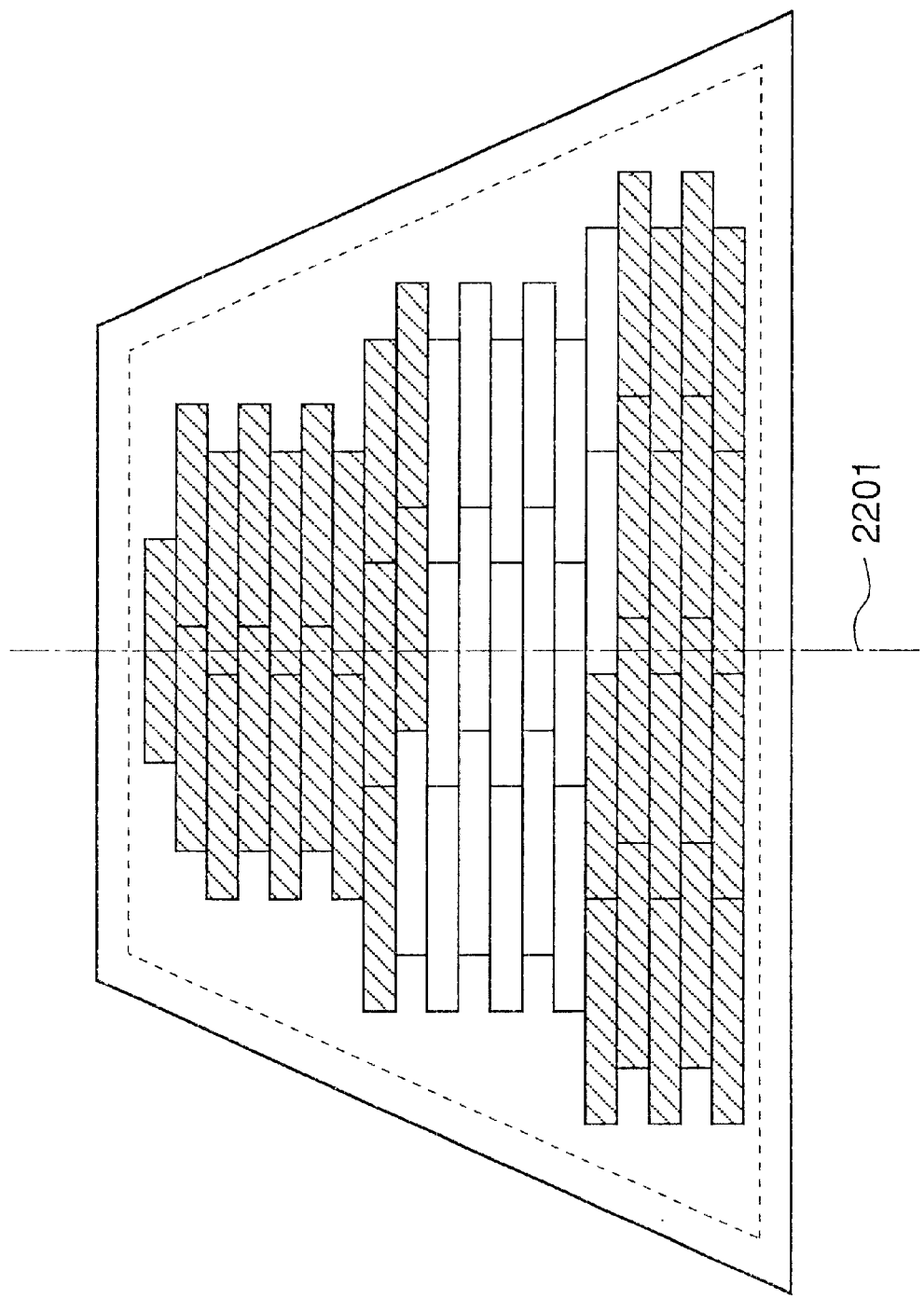
FIG. 27 is a view showing a final output result according to the third embodiment of the present invention.
Figure 28:
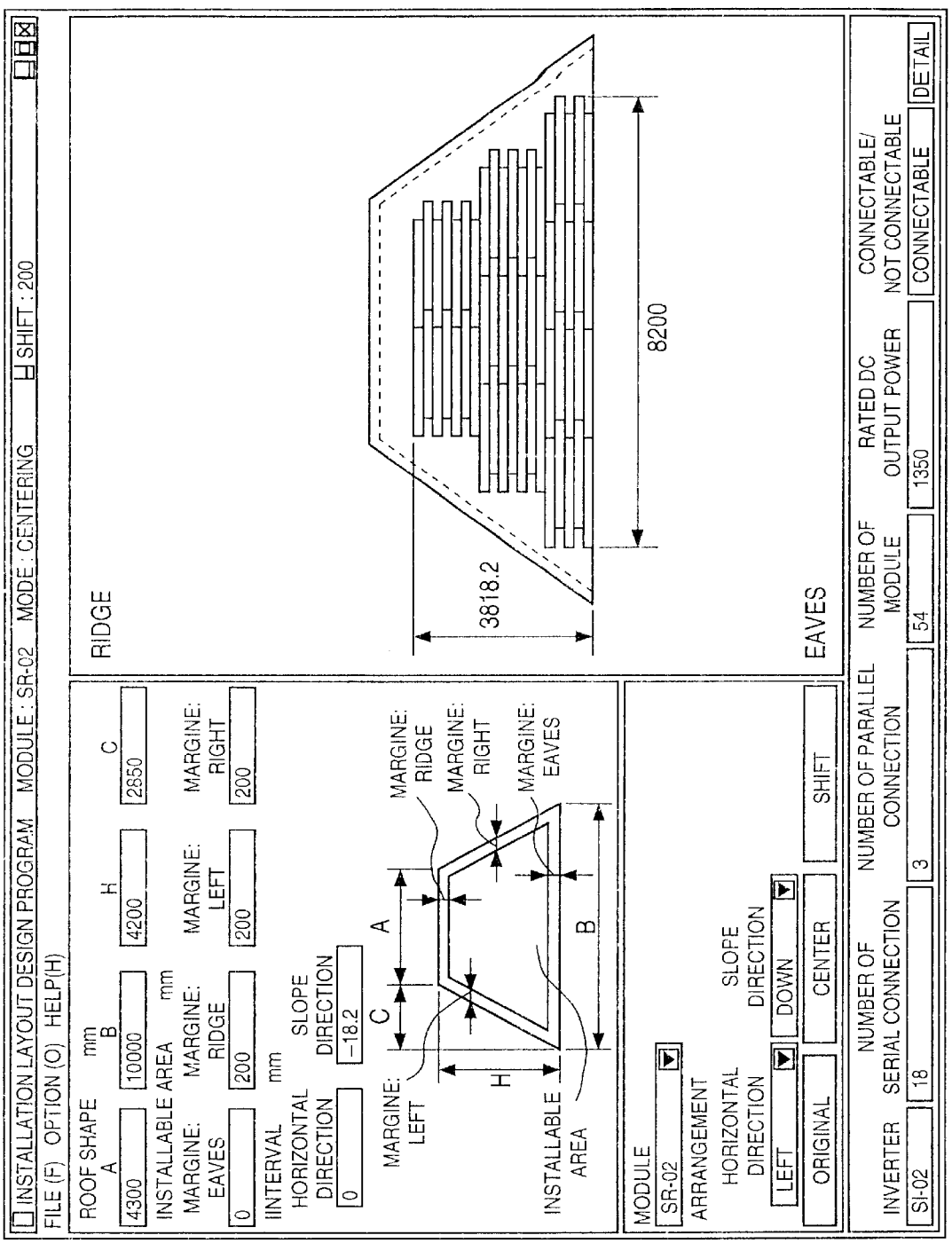
FIG. 28 shows an overall image displayed on a monitor including the image shown in FIG. 27 according to the third embodiment of the present invention.
Figure 32A:
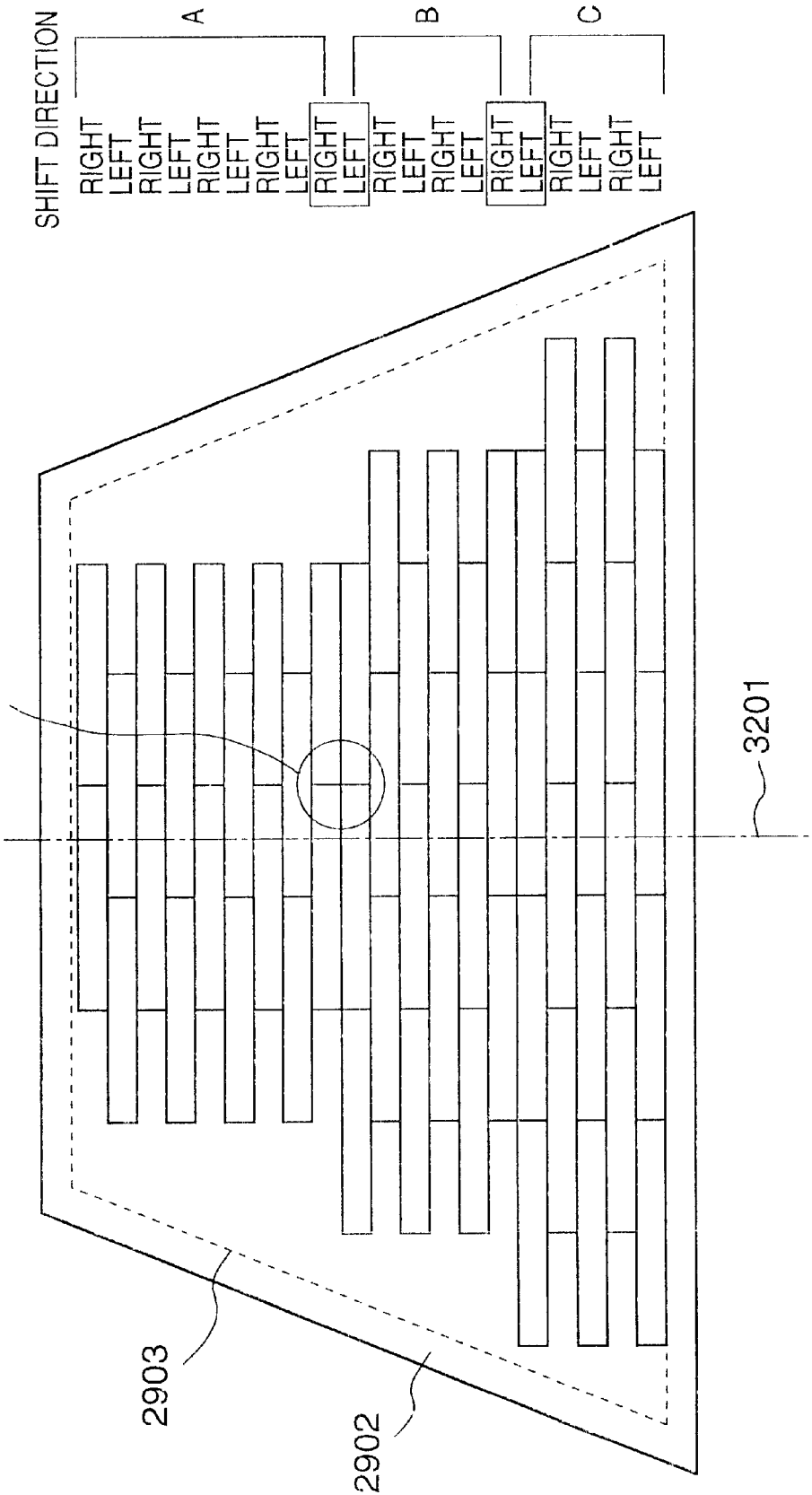
FIG. 32A and FIG. 32B are views showing an arrangement of solar cell modules when shifting directions are controlled so alternate.
Figure 32B:
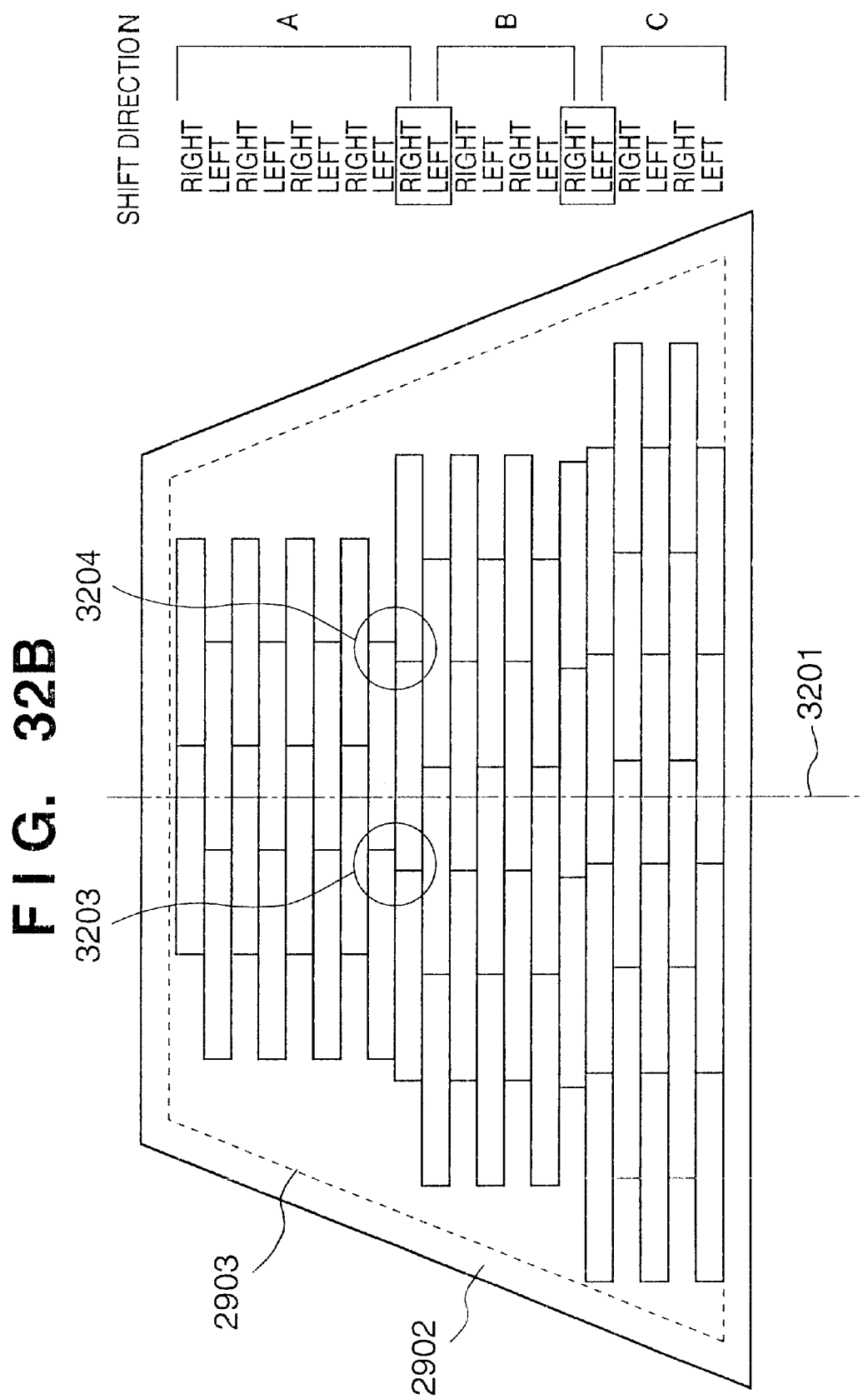

Further, in step S2008 for calculating the installation position information, the installation position of each solar cell module is calculated and the required number of solar cell modules is determined in the same manner as described in the first and second embodiments. Further, in step S2402, candidates of connectable arrangements of solar cell modules are calculated. Below, an operation of the calculation is explained with reference to FIG. 25.

First, in steps S2501 to S2503, the maximum number Smax and the minimum number Smin of solar cell modules to be connected in series, and the possible maximum connectable number Tmax are calculated on the basis of the input voltage range and the allowable input power read from the inverter database, the open voltage, the operation voltage, and the output power of the solar cell module.

In step S2504, whether or not the required number, T, of solar cell modules to be installed calculated in step S2008 exceeds the maximum connectable number Tmax is determined, and if not, the process proceeds to step S2506 where the calculated number T is set as the number $T_0$ of solar cell modules to be connected. If the number T exceeds the maximum number Tmax, then the maximum number Tmax is set as the number $T_0$ of solar cell modules to be connected.

In steps S2507 to S2514, by dividing the set number $T_0$ by an integer S which is a number between the minimum number Smin and the maximum number Smax of solar cell modules connectable in series (i.e., S=Smin+i, where i is an integer between 0 and (Smax−Smin)), the number of solar cell module rows which can be connected in parallel is obtained as a quotient Pi. In step S2511, the connectable number of the solar cell modules is obtained by multiplying the serial connection number S by the quotient Pi. Then, the obtained results are displayed on the display device 512 as a table of connection candidates as shown in FIG. 26.

In step S2404, a user selects the desirable connection from the table. Note, if the connectable number obtained in step S2511 is the same as the required number of the solar cell module calculated in step S2008, then it is unnecessary to change the installation positions of the solar cell modules. Whereas, if the connectable number obtained in step S2511 is smaller than the number calculated in step S2008, then a solar cell module or modules are deleted by the number of difference in the opposite order of the installation order. If the centering and/or shifting operation has been designated, then these processes are performed again.

The installation positions of the solar cell modules are calculated as above, and the obtained result is additionally displayed over the image of the installation surface which is already displayed on the display device 512.

Further, solar cell modules may be expressed in different colors by serially connected solar cell modules so that which solar cell modules are serially connected can be known from the displayed image.

Further, the acquired installation information may be stored in a storage device and printed out by the printer 511 in response to a user designation.

In the third embodiment, similarly to the first and second embodiments, a program which operates on the Windows 95™ available from Microsoft Corporation is made.

It should be noted that the third embodiment is also applicable to the second embodiment in which a roof plan is used for inputting data of the installation surface.

According to the program of the third embodiment as described above, it is possible to achieve the same advantages of the first or second embodiments.

It should be noted that the processes are also explained with reference to flowcharts in the third embodiment, however, the order of the input and operation processes may be changed arbitrary so long as no problem is caused by changing the order.

The present invention is not limited to the above embodiments and various changes and modifications can be made within the spirit and scope of the present invention. Therefore to appraise the public of the scope of the present invention, the following claims are made.

What is claimed is:

1. A computer processing method for designing an installation layout of solar cell modules on an installation surface in a photovoltaic power generation system comprising:

a solar cell module information acquisition step of acquiring information on a solar cell module;

an installation surface information acquisition step of acquiring information on an installation surface where the solar cell module is to be installed;

an installation condition acquisition step of acquiring installation conditions of the solar cell module;

an installation information calculation step of calculating installation information for arranging the solar cell module on the installation surface on the basis of information acquired in said solar cell module information acquisition step, said installation surface information acquisition step, and said installation condition acquisition step;

and an installation information output step of outputting the installation information calculated in said installation information calculation step.

2. The computer processing method according to claim 1, wherein, in said installation information calculation step, plurality of solar cell modules are divided into a plurality of groups, installation positions of the solar cell modules are calculated by the groups in accordance with predetermined rules, and positions of the groups are calculated by the groups.

3. The computer processing method according to claim 2, wherein, in said installation information calculation step, a number of solar cell modules is obtained for each row of the arranged solar cell modules, and solar cell modules in adjoining rows each includes the same number of solar cell modules are grouped.

4. The computer processing method according to claim 3, wherein, in said installation information calculation step, the installation positions of the solar cell modules in each group are calculated with reference to a row having a minimum area where no solar cell module is arranged in each group.

5. The computer processing method according to claim 3, wherein, in said installation information calculation step, positions of the solar cell modules are shifted by rows by a shift amount and a shift direction which are manually inputted or predetermined, and the installation information is obtained on the basis of the shifted positions.

6. The computer processing method according to claim 3, wherein, in said installation information calculation step, positions of the solar cell modules are shifted by rows by a shift amount and a shift direction which are manually inputted or predetermined, whereby phases of the shift directions of adjoining blocks are opposite, and the installation information is obtained on the basis of the shifted positions.

7. The computer processing method according to claim 2, wherein, in said installation information calculation step, the installation information is calculated so that the solar cell modules are aligned perpendicular to or parallel to a reference line on the installation surface.

8. The computer processing method according to claim 7, wherein, in said installation information calculation step, when the reference line is not along an x axis or a y axis, coordinates of the installation surface are converted so that the reference line is along the x or y axis, then the installation information is calculated.

9. The computer processing method according to claim 2, wherein, in said installation information calculation step, a reference line is set on the installation surface having a steepest slope among a plurality of installation surfaces, interval between columns of the solar cell modules is set on the basis of a shape of the solar cell modules, and the installation information is calculated so that the solar cell modules are aligned perpendicular to or parallel to the reference line on the installation surface at the set interval.

10. The computer processing method according to claim 9, wherein, in said installation information calculation step, when the reference line is not along an x axis or a y axis, coordinates of the installation surface are converted so that the reference line is along the x or y axis, then the installation information is calculated.

11. The computer processing method according to claim 9, wherein, in said installation information calculation step, when the installation surface is expressed as a roof plan, information of the installation surface is generated on the basis of the roof plan, a slope direction and a slope angle, then the installation information is calculated.

12. The computer processing method according to claim 2, wherein said installation information calculation step comprises an installation information changing step of obtaining information for deleting or displacing a solar cell module among the arranged solar cell modules and changing the installation information.

13. The computer processing method according to claim 2, wherein said installation information calculation step comprises an installation information changing step of obtaining information for adding a solar cell module in the installation surface and changing the installation information.

14. The computer processing method according to claim 2, wherein said photovoltaic power generation system includes an electric device to be connected to the solar cell modules arranged on the installation surface, and said installation information calculation step comprises an electric connection candidate calculation step of calculating allowable numbers of solar cell modules connected in series and in parallel, and a number of required solar cell modules while satisfying a rated input of the electric device and a condition that the required solar cell modules are equal to or less than an allowable number of solar cell modules to be connected calculated on the basis of the rated input of the electric device and information on output power of a solar cell module as candidates of electric connections.

15. The computer processing method according to claim 14, wherein said installation information calculation step includes an optimum electric connection calculation step of selecting an optimum electric connection among the candidates of electric connections calculated in said electric connection candidate calculation step and an installation information changing step of changing the installation information on the basis of the number of required solar cell modules selected in said optimum electric connection calculation step.

16. A computer processing method for designing an installation layout of solar cell modules on an installation surface in a photovoltaic power generation system comprising an installation information calculation step having:
a step of dividing the solar cell modules into groups;
a step of calculating an installation position of each of the solar cell modules in accordance with predetermined rules; and
a step of calculating an installation position of each of the groups.

17. The computer processing method according to claim 16, wherein, in said step of dividing the solar cell modules into the groups, a number of solar cell modules is obtained for each row of the arranged solar cell modules, and solar cell modules in adjoining rows each includes the same number of solar cell modules are grouped, and in said step of calculating the installation position of each of the groups, the installation positions of the solar cell modules in each group are calculated with reference to a row having a minimum area where no solar cell module is arranged in each group.

18. The computer processing method according to claim 17, wherein, in said installation information calculation step, positions of the solar cell modules are shifted by rows by a shift amount and a shift direction which are manually inputted or predetermined, and the installation information is obtained on the basis of the shifted positions.

19. The computer processing method according to claim 17 wherein, in said installation information calculation step, positions of the solar cell modules are shifted by rows by a shift amount and a shift direction which are manually inputted or predetermined, whereby phases of the shift directions of adjoining blocks are opposite, and the installation information is obtained on the basis of the shifted positions.

20. The computer processing method according to claim 16, wherein, in said installation information calculation step, the installation information is calculated so that the solar cell modules are aligned perpendicular to or parallel to a reference line on the installation surface.

21. The computer processing method according to claim 20, wherein, in said installation information calculation step, when the reference line is not along an x axis or a y axis, coordinates of the installation surface are converted so that the reference line is along the x or y axis, then the installation information is calculated.

22. The computer processing method according to claim 16, wherein, in said installation information calculation step, a reference line is set on the installation surface having a steepest slope among a plurality of installation surfaces, interval between columns of the solar cell modules is set on the basis of a shape of the solar cell modules, and the installation information is calculated so that the solar cell modules are aligned perpendicular to or parallel to the reference line on the installation surface at the set interval.

23. The computer processing method according to claim 22, wherein, in said installation information calculation step, when the reference line is not along an x axis or a y axis, coordinates of the installation surface are converted so that the reference line is along the x or y axis, then the installation information is calculated.

24. The computer processing method according to claim 22, wherein, in said installation information calculation step, when the installation surface is expressed as a roof plan, information of the installation surface is generated on the basis of the roof plan, a slope direction and a slope angle, then the installation information is calculated.

25. The computer processing method according to claim 16, wherein said installation information calculation step comprises an installation information changing step of obtaining information for deleting or displacing a solar cell module among the arranged solar cell modules and changing the installation information.

26. The computer processing method according to claim 16, wherein said installation information calculation step comprises an installation information changing step of obtaining information for adding a solar cell module in the installation surface and changing the installation information.

27. The computer processing method according to claim 16, wherein said photovoltaic power generation system includes an electric device to be connected to the solar cell modules arranged on the installation surface, and said installation information calculation step comprises an electric connection candidate calculation step of calculating allowable numbers of solar cell modules connected in series and in parallel, and a number of required solar cell modules while satisfying a rated input of the electric device and a condition that the required solar cell modules are equal to or less than an allowable number of solar cell modules to be connected calculated on the basis of the rated input of the electric device and information on output power of a solar cell module as candidates of electric connections.

28. The computer processing method according to claim 27, wherein said installation information calculation step includes an optimum electric connection calculation step of selecting an optimum electric connection among the candidates of electric connections calculated in said electric connection candidate calculation step and an installation information changing step of changing the installation information on the basis of the number of required solar cell modules selected in said optimum electric connection calculation step.

29. A computer processing method for designing an installation layout of solar cell modules on an installation surface in a photovoltaic power generation system comprising an installation information calculation step having:
  a step of dividing the solar cell modules into groups; and
  a step of shifting positions of the solar cell modules by rows by a shift amount and a shift direction which are manually inputted or predetermined, whereby phases of the shift directions of adjoining blocks are opposite, and calculating installation information of the solar cell modules on the basis of the shifted positions.

30. The computer processing method according to claim 29, wherein, in said step of dividing the solar cell modules into the groups, a number of solar cell modules is obtained for each row of the arranged solar cell modules, and solar cell modules in adjoining rows each includes the same number of solar cell modules are grouped.

31. The computer processing method according to claim 29, wherein, in said installation information calculation step, the installation information is calculated so that the solar cell modules are aligned perpendicular to or parallel to a reference line on the installation surface.

32. The computer processing method according to claim 31, wherein, in said installation information calculation step, when the reference line is not along an x axis or a y axis, coordinates of the installation surface are converted so that the reference line is along the x or y axis, then the installation information is calculated.

33. The computer processing method according to claim 29, wherein, in said installation information calculation step, a reference line is set on the installation surface having a steepest slope among a plurality of installation surfaces, interval between columns of the solar cell modules is set on the basis of a shape of the solar cell modules, and the installation information is calculated so that the solar cell modules are aligned perpendicular to or parallel to the reference line on the installation surface at the set interval.

34. The computer processing method according to claim 33, wherein, in said installation information calculation step, when the reference line is not along an x axis or a y axis, coordinates of the installation surface are converted so that the reference line is along the x or y axis, then the installation information is calculated.

35. The computer processing method according to claim 33, wherein, in said installation information calculation step, when the installation surface is expressed as a roof plan, information of the installation surface is generated on the basis of the roof plan, a slope direction and a slope angle, then the installation information is calculated.

36. The computer processing method according to claim 29, wherein said installation information calculation step comprises an installation information changing step of obtaining information for deleting or displacing a solar cell module among the arranged solar cell modules and changing the installation information.

37. The computer processing method according to claim 29, wherein said installation information calculation step comprises an installation information changing step of obtaining information for adding a solar cell module in the installation surface and changing the installation information.

38. The computer processing method according to claim 29, wherein said photovoltaic power generation system includes an electric device to be connected to the solar cell modules arranged on the installation surface, and said installation information calculation step comprises an electric connection candidate calculation step of calculating allowable numbers of solar cell modules connected in series and in parallel, and a number of required solar cell modules while satisfying a rated input of the electric device and a condition that the required solar cell modules are equal to or less than an allowable number of solar cell modules to be connected calculated on the basis of the rated input of the electric device and information on output power of a solar cell module as candidates of electric connections.

39. The computer processing method according to claim 38, wherein said installation information calculation step includes an optimum electric connection calculation step of selecting an optimum electric connection among the candidates of electric connections calculated in said electric connection candidate calculation step and an installation information changing step of changing the installation information on the basis of the number of required solar cell modules selected in said optimum electric connection calculation step.

40. A processing apparatus for designing an installation layout of solar cell modules in a photovoltaic power generation system comprising:
  solar cell module information acquisition means for acquiring information on a solar cell module;
  installation surface information acquisition means for acquiring information on an installation surface where the solar cell module is to be installed;
  installation condition acquisition means for acquiring installation conditions of the solar cell module;
  installation information calculation means for calculating installation information for arranging the solar cell module on the installation surface on the basis of information acquired by said solar cell module information acquisition means, said installation surface information acquisition means, and said installation condition acquisition means; and installation information output means for outputting the installation information calculated by said installation information calculation means.

41. The processing apparatus according to claim 40, wherein, said installation information calculation means divides plurality of solar cell modules into a plurality of groups, calculates installation positions of the solar cell modules by the groups in accordance with predetermined rules, and calculates positions of the groups by the groups.

42. The processing apparatus according to claim 41, wherein said installation information calculation means obtains a number of solar cell modules for each row of the arranged solar cell modules, and groups solar cell modules in adjoining rows each includes the same number of solar cell modules.

43. The processing apparatus according to claim 42, wherein said installation information calculation means calculates the installation positions of the solar cell modules in each group with reference to a row having a minimum area where no solar cell module is arranged in each group.

44. The processing apparatus according to claim 43, wherein said installation information calculation means shifts positions of the solar cell modules by rows by a shift amount and a shift direction which are manually inputted or predetermined, and obtains the installation information on the basis of the shifted positions.

45. The processing apparatus according to claim 42, wherein said installation information calculation means shifts positions of the solar cell modules by rows by a shift amount and a shift direction which are manually inputted or predetermined, whereby phases of the shift directions of adjoining blocks are opposite, and the installation information is obtained on the basis of the shifted positions.

46. The processing apparatus according to claim 41, wherein said installation information calculation means calculates the installation information so that the solar cell modules are aligned perpendicular to or parallel to a reference line on the installation surface.

47. The processing apparatus according to claim 46, wherein, when the reference line is not along an x axis or a y axis, said installation information calculation means converts coordinates of the installation surface so that the reference line is along the x or y axis, then the installation information is calculated.

48. The processing apparatus according to claim 41, wherein said installation information calculation means sets a reference line on the installation surface having a steepest slope among a plurality of installation surfaces, sets interval between columns of the solar cell modules on the basis of a shape of the solar cell modules, and calculates the installation information so that the solar cell modules are aligned perpendicular to or parallel to the reference line on the installation surface at the set interval.

49. The processing apparatus according to claim 48, wherein, when the reference line is not along an x axis or a y axis, said installation information calculation means converts coordinates of the installation surface so that the reference line is along the x or y axis, then the installation information is calculated.

50. The processing apparatus according to claim 48, wherein, when the installation surface is expressed as a roof plan, said installation information calculation means generates information of the installation surface on the basis of the roof plan, a slope direction and a slope angle, then calculates the installation information.

51. The processing apparatus according to claim 41, wherein said installation information calculation means comprises an installation information changing means for obtaining information for deleting or displacing a solar cell module among the arranged solar cell modules and changing the installation information.

52. The processing apparatus according to claim 41, wherein said installation information calculation means comprises installation information changing means for obtaining information for adding a solar cell module in the installation surface and changing the installation information.

53. The processing apparatus according to claim 41, wherein said photovoltaic power generation system includes an electric device to be connected to the solar cell modules arranged on the installation surface, and said installation information calculation means comprises electric connection candidate calculation means for calculating allowable numbers of solar cell modules connected in series and in parallel, and a number of required solar cell modules while satisfying a rated input of the electric device and a condition that the required solar cell modules are equal to or less than an allowable number of solar cell modules to be connected calculated on the basis of the rated input of the electric device and information on output power of a solar cell module as candidates of electric connections.

54. The processing apparatus according to claim 53, wherein said installation information calculation means includes optimum electric connection calculation means for selecting an optimum electric connection among the candidates of electric connections calculated by said electric connection candidate calculation means and installation information changing means for changing the installation information on the basis of the number of required solar cell modules selected by said optimum electric connection calculation means.

55. A processing apparatus for designing an installation layout of solar cell modules on an installation surface in a photovoltaic power generation system comprising installation information calculation means having:

means for dividing the solar cell modules into groups;

means for calculating an installation position of each of the solar cell modules in accordance with predetermined rules; and means for calculating an installation position of each of the groups.

56. The processing apparatus according to claim 55, wherein said means of dividing the solar cell modules into the groups obtains a number of solar cell modules for each row of the arranged solar cell modules, and groups solar cell modules in adjoining rows each includes the same number of solar cell modules, and said means of calculating the installation position of each of the groups calculates the installation positions of the solar cell modules in each group with reference to a row having a minimum area where no solar cell module is arranged in each group.

57. The processing apparatus according to claim 56, wherein said installation information calculation means shifts positions of the solar cell modules by rows by a shift amount and a shift direction which are manually inputted or predetermined, and obtains the installation information on the basis of the shifted positions.

58. The processing apparatus according to claim 56, wherein said installation information calculation means shifts positions of the solar cell modules by rows by a shift amount and a shift direction which are manually inputted or predetermined, whereby phases of the shift directions of adjoining blocks are opposite, and the installation information is obtained on the basis of the shifted positions.

59. The processing apparatus according to claim 55, wherein said installation information calculation means calculates the installation information so that the solar cell modules are aligned perpendicular to or parallel to a reference line on the installation surface.

60. The processing apparatus according to claim 59, wherein, when the reference line is not along an x axis or a y axis, said installation information calculation means converts coordinates of the installation surface so that the reference line is along the x or y axis, then the installation information is calculated.

61. The processing apparatus according to claim 55, wherein said installation information calculation means sets a reference line on the installation surface having a steepest slope among a plurality of installation surfaces, sets interval between columns of the solar cell modules on the basis of a shape of the solar cell modules, and calculates the installation information so that the solar cell modules are aligned perpendicular to or parallel to the reference line on the installation surface at the set interval.

62. The processing apparatus according to claim 61, wherein, when the reference line is not along an x axis or a y axis, said installation information calculation means converts coordinates of the installation surface so that the reference line is along the x or y axis, then the installation information is calculated.

63. The processing apparatus according to claim 61, wherein, when the installation surface is expressed as a roof plan, said installation information calculation means generates information of the installation surface on the basis of the roof plan, a slope direction and a slope angle, then calculates the installation information.

64. The processing apparatus according to claim 55, wherein said installation information calculation means comprises an installation information changing means for obtaining information for deleting or displacing a solar cell module among the arranged solar cell modules and changing the installation information.

65. The processing apparatus according to claim 55, wherein said installation information calculation means comprises installation information changing means for obtaining information for adding a solar cell module in the installation surface and changing the installation information.

66. The processing apparatus according to claim 55, wherein said photovoltaic power generation system includes an electric device to be connected to the solar cell modules arranged on the installation surface, and said installation information calculation means comprises electric connection candidate calculation means for calculating allowable numbers of solar cell modules connected in series and in parallel, and a number of required solar cell modules while satisfying a rated input of the electric device and a condition that the required solar cell modules are equal to or less than an allowable number of solar cell modules to be connected calculated on the basis of the rated input of the electric device and information on output power of a solar cell module as candidates of electric connections.

67. The processing apparatus according to claim 66, wherein said installation information calculation means includes optimum electric connection calculation means for selecting an optimum electric connection among the candidates of electric connections calculated by said electric connection candidate calculation means and installation information changing means for changing the installation information on the basis of the number of required solar cell modules selected by said optimum electric connection calculation means.

68. A processing apparatus for designing an installation layout of solar cell modules on an installation surface in a photovoltaic power generation system comprising installation information calculation means having:
    means for dividing the solar cell modules into groups; and
    means for shifting positions of the solar cell modules by rows by a shift amount and a shift direction which are manually inputted or predetermined, whereby phases of the shift directions of adjoining blocks are opposite.

69. The processing apparatus according to claim 68, wherein said means of dividing the solar cell modules into the groups obtains a number of solar cell modules for each row of the arranged solar cell modules, and groups solar cell modules in adjoining rows each includes the same number of solar cell modules.

70. The processing apparatus according to claim 68, wherein said installation information calculation means calculates the installation information so that the solar cell modules are aligned perpendicular to or parallel to a reference line on the installation surface.

71. The processing apparatus according to claim 70, wherein, when the reference line is not along an x axis or a y axis, said installation information calculation means converts coordinates of the installation surface so that the reference line is along the x or y axis, then the installation information is calculated.

72. The processing apparatus according to claim 68, wherein said installation information calculation means sets a reference line on the installation surface having a steepest slope among a plurality of installation surfaces, sets interval between columns of the solar cell modules on the basis of a shape of the solar cell modules, and calculates the installation information so that the solar cell modules are aligned perpendicular to or parallel to the reference line on the installation surface at the set interval.

73. The processing apparatus according to claim 72, wherein, when the reference line is not along an x axis or a y axis, said installation information calculation means converts coordinates of the installation surface so that the reference line is along the x or y axis, then the installation information is calculated.

74. The processing apparatus according to claim 72, wherein, when the installation surface is expressed as a roof plan, said installation information calculation means generates information of the installation surface on the basis of the roof plan, a slope direction and a slope angle, then calculates the installation information.

75. The processing apparatus according to claim 68, wherein said installation information calculation means comprises an installation information changing means for obtaining information for deleting or displacing a solar cell module among the arranged solar cell modules and changing the installation information.

76. The processing apparatus according to claim 68, wherein said installation information calculation means comprises installation information changing means for obtaining information for adding a solar cell module in the installation surface and changing the installation information.

77. The processing apparatus according to claim 68, wherein said photovoltaic power generation system includes an electric device to be connected to the solar cell modules arranged on the installation surface, and said installation information calculation means comprises electric connection candidate calculation means for calculating allowable numbers of solar cell modules connected in series and in parallel, and a number of required solar cell modules while satisfying a rated input of the electric device and a condition that the required solar cell modules are equal to or less than an allowable number of solar cell modules to be connected calculated on the basis of the rated input of the electric device and information on output power of a solar cell module as candidates of electric connections.

78. The processing apparatus according to claim 77, wherein said installation information calculation means includes optimum electric connection calculation means for selecting an optimum electric connection among the candidates of electric connections calculated by said electric connection candidate calculation means and installation information changing means for changing the installation information on the basis of the number of required solar cell modules selected by said optimum electric connection calculation means.

79. A computer program product comprising a computer usable medium having computer readable program code means embodied in said medium for designing an installation layout of solar cell modules on an installation surface in a photovoltaic power generation system, said product including:

first computer readable program code means of solar cell module information acquisition step for acquiring information on a solar cell module;

second computer readable program code means of installation surface information acquisition step for acquiring information on an installation surface where the solar cell module is to be installed;

third computer readable program code means of installation condition acquisition step for acquiring installation conditions of the solar cell module;

fourth computer readable program code means of installation information calculation step for calculating installation information for arranging the solar cell module on the installation surface on the basis of information acquired in said solar cell module information acquisition step, said installation surface information acquisition step, and said installation condition acquisition step; and fifth computer readable program code means of installation information output step for outputting the installation information calculated in said installation information calculation step.

80. A computer program product comprising a computer usable medium having computer readable program code means embodied in said medium for designing an installation layout of solar cell modules on an installation surface in a photovoltaic power generation system, said product including:

first computer readable program code means for dividing the solar cell modules into groups;

second computer readable program code means for calculating an installation position of each of the solar cell modules in accordance with predetermined rules; and third computer readable program code means for calculating an installation position of each of the groups.

81. A computer program product comprising a computer usable medium having computer readable program code means embodied in said medium for designing an installation layout of solar cell modules on an installation surface in a photovoltaic power generation system, said product including:

first computer readable program code means for dividing the solar cell modules into groups; and second computer readable program code means for shifting positions of the solar cell modules by rows by a shift amount and a shift direction which are manually inputted or predetermined, whereby phases of the shift directions of adjoining blocks are opposite, and calculating installation information of the solar cell modules on the basis of the shifted positions.

\* \* \* \* \*

UNITED STATES PATENT AND TRADEMARK OFFICE
CERTIFICATE OF CORRECTION

PATENT NO. : 6,546,535 B1  
DATED : April 8, 2003  
INVENTOR(S) : Nagao et al.

It is certified that error appears in the above-identified patent and that said Letters Patent is hereby corrected as shown below:

Title page,
Item [56], OTHER PUBLICATIONS, please insert -- Standard of Roofing Materials, Exterior Materials, and Curtain Walls Facing Outside", Notification No. 109, Ministry of Construction, pp. 615-621 (1950) --.

Column 5,
Line 23, "solar." should read -- solar --; and
Line 28, "so" should read -- to --.

Column 6,
Line 28, "ate" should read -- are --; and
Line 58, "sur face," should read -- surface, --.

Signed and Sealed this

Thirtieth Day of December, 2003

JAMES E. ROGAN
*Director of the United States Patent and Trademark Office*